(12) United States Patent
Yamasaki et al.

(10) Patent No.: US 11,332,838 B2
(45) Date of Patent: May 17, 2022

(54) PLATING APPARATUS

(71) Applicant: EBARA CORPORATION, Tokyo (JP)

(72) Inventors: Gaku Yamasaki, Tokyo (JP);
Tomonori Hirao, Tokyo (JP); Toshio Yokoyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 666 days.

(21) Appl. No.: 16/129,227

(22) Filed: Sep. 12, 2018

(65) Prior Publication Data

US 2019/0093250 A1    Mar. 28, 2019

(30) Foreign Application Priority Data

Sep. 22, 2017 (JP) ............... JP2017-182570

(51) Int. Cl.
| | |
|---|---|
| *C25D 5/02* | (2006.01) |
| *C25D 17/00* | (2006.01) |
| *C25D 21/12* | (2006.01) |
| *C25D 5/10* | (2006.01) |
| *C25D 17/12* | (2006.01) |
| *C25D 7/12* | (2006.01) |

(Continued)

(52) U.S. Cl.
CPC ............... *C25D 5/10* (2013.01); *C25D 5/02* (2013.01); *C25D 5/022* (2013.01); *C25D 5/04* (2013.01); *C25D 7/123* (2013.01); *C25D 17/001* (2013.01); *C25D 17/007* (2013.01); *C25D 17/008* (2013.01); *C25D 17/12* (2013.01); *C25D 21/12* (2013.01); *H05K 3/423* (2013.01)

(58) Field of Classification Search
CPC .... C25D 5/022; C25D 17/007; C25D 17/008; C25D 5/02
See application file for complete search history.

(56) References Cited

U.S. PATENT DOCUMENTS

| | | | | | |
|---|---|---|---|---|---|
| 4,784,740 | A | * | 11/1988 | Murakami | ........... C25D 7/0635 204/206 |
| 2009/0139871 | A1 | * | 6/2009 | Saito | ...................... C25D 21/12 205/148 |

(Continued)

FOREIGN PATENT DOCUMENTS

| | | |
|---|---|---|
| CN | 102431425 A | 5/2012 |
| JP | S62-116799 A | 5/1987 |

(Continued)

OTHER PUBLICATIONS

Singapore Patent Application No. 10201806376S; Search Report and Written Opinion; dated Oct. 19, 2020; 8 pages.

*Primary Examiner* — Ciel P Contreras
(74) *Attorney, Agent, or Firm* — BakerHostetler

(57) ABSTRACT

A plating apparatus including a plating bath, a substrate holder to be arranged in the plating bath and adapted to hold a substrate, an anode for generating an electric field between the substrate and the anode, and at least one electric field shielding body for shielding the substrate holder and a part or the whole of the electric field, wherein the electric field shielding body has an opening portion for allowing the electric field between the substrate and the anode to pass therethrough, and is configured so as to be capable of adjusting an opening size in a first direction of the opening portion and an opening size in a second direction of the opening portion independently of each other.

19 Claims, 36 Drawing Sheets

(51) Int. Cl.
*H05K 3/42* (2006.01)
*C25D 5/04* (2006.01)

(56) References Cited

U.S. PATENT DOCUMENTS

| | | |
|---|---|---|
| 2012/0068503 A1 | 3/2012 | Uehara et al. |
| 2013/0248361 A1 | 9/2013 | Sto. Domingo |
| 2014/0231245 A1* | 8/2014 | Sandmann ............ C25D 17/008 204/230.3 |
| 2016/0145760 A1* | 5/2016 | Fujikata ................. C25D 17/06 205/128 |
| 2016/0194780 A1* | 7/2016 | Nagai .................... C25D 17/06 204/242 |
| 2020/0270760 A1 | 8/2020 | Nakagawa et al. |

FOREIGN PATENT DOCUMENTS

| | | |
|---|---|---|
| JP | H02-145791 A | 6/1990 |
| JP | H06-017297 A | 1/1994 |
| JP | H10-130896 A | 5/1998 |
| JP | 2013-072139 A | 4/2013 |
| JP | 2016-098399 A | 5/2016 |
| WO | WO 2017/110432 A1 | 6/2017 |

* cited by examiner

Right ←——→ Left

Right ⟷ Left

A-A

B-B

Right ⟷ Left

Left ⟷ Right

PLATING APPARATUS

CROSS-REFERENCE TO RELATED APPLICATIONS

This application is based upon and claims benefit of priority from Japanese Patent Application No. 2017-182570 filed on Sep. 22, 2017, the entire contents of which are incorporated herein by reference.

TECHNICAL FIELD

The present invention relates to a plating apparatus.

BACKGROUND ART

It has been conventionally performed to form wires in fine trenches for wiring, holes or resist opening portions provided in the surface of a substrate such as a semiconductor wafer or the like, or form, on the surface of a substrate, bumps (protruding electrodes) to be electrically connected to electrodes, etc. of a package. For example, an electrolytic plating method, a vapor deposition method, a printing method, a ball bumping method, etc. are known as methods for forming wires and bumps. Following increase in the number of I/Os of a semiconductor chip and narrowing of pitches, the electrolytic plating method which can perform microfabrication and is relatively stable in performance has been increasingly used.

When wires or bumps are formed by the electrolytic plating method, a seed layer (power supply layer) having low electric resistance is formed on the surface of barrier metal provided in trenches for wiring, holes or resist opening portions in a substrate. A plating film grows on the surface of the seed layer. Following microfabrication of wires and bumps, seed layers having smaller film thicknesses have been recently used. As the thickness of the seed layer decreases, the electric resistance (sheet resistance) of the seed layer increases.

In general, a substrate to be plated has an electric contact at a peripheral edge portion thereof. Therefore, current which corresponds to the combined resistance of an electric resistance value of plating solution and an electric resistance value of a seed layer extending from a center portion of the substrate to the electric contact flows in the center portion of the substrate. On the other hand, current which substantially corresponds to the electric resistance value of the plating solution flows in the peripheral edge portion (in the vicinity of the electric contact) of the substrate. That is, the current is difficult to flow in the center portion of the substrate by the degree corresponding to the electric resistance value of the seed layer extending from the center portion of the substrate to the electric contact. A phenomenon in which current concentrates on the peripheral edge portion of the substrate is called as a terminal effect.

In a substrate including a seed layer having a relatively small film thickness, the electric resistance value of the seed layer from the center portion of the substrate to the electric contact is relatively large. Therefore, when plating is performed on a substrate including a seed layer having a relatively small film thickness, the terminal effect becomes remarkable. Furthermore, as the size of the substrate increases, the electric resistance value of the seed layer from the center portion of the substrate to the electric contact increases. As a result, the plating rate at the center portion of the substrate decreases, and the film thickness of the plating film at the center portion of the substrate becomes smaller than the plating film at the peripheral edge portion of the substrate, so that in-plane uniformity of the film thickness may decrease.

In order to suppress deterioration of the in-plane uniformity of the film thickness caused by the terminal effect, it is necessary to adjust an electric field applied to the substrate. There is known a plating apparatus including an anode mask capable of adjusting the electric field directed from an anode to a circular substrate as described in Japanese Patent Laid-Open No. 2016-98399 (PTL 1). Furthermore, there is known a plating apparatus including a current blocking unit which is provided at a position distant from an anode between a substrate and the anode as described in Japanese Patent Laid-Open No. H6-17297 (PTL 2).

Incidentally, when plating is performed not on a circular substrate such as a circular semiconductor wafer, but on a rectangular or square-shaped substrate, substrates to be processed have various aspect ratios. In addition, the variation of arrangement of patterns of concave portions, etc. to be filled with metal by plating also increases. In order to perform plating with excellent uniformity in film thickness on such a rectangular substrate, it is becoming difficult to sufficiently control an electric field by the conventional current blocking means. Furthermore, even in the case of substrates other than the rectangular substrate, for example, a circular substrate, it may be desired to make the plating film thickness of the outer peripheral portion more uniform in some cases.

CITATION LIST

Patent Literature

PTL 1: Japanese Patent Laid-Open No. 2016-98399
PTL 2: Japanese Patent Laid-Open No. H6-17297

SUMMARY OF INVENTION

Technical Problem

An object of the present invention is to enhance an electric field adjusting function in a plating apparatus.

Solution to Problem

An aspect of the present invention relates to a plating apparatus, and the plating apparatus includes a plating bath, a substrate holder to be arranged in the plating bath and adapted to hold a substrate, an anode arranged so as to face the substrate holder, and at least one electric field shielding body for shielding a part of an electric field from the anode to the substrate, wherein the electric field shielding body has an opening portion for allowing the electric field between the substrate and the anode to pass therethrough, and is configured so as to be capable of adjusting an opening size in a first direction of the opening portion and an opening size in a second direction of the opening portion independently of each other.

An aspect of the present invention relates to a plating apparatus, and the plating apparatus includes a plating bath, a substrate holder to be arranged in the plating bath and adapted to hold a substrate, an anode arranged so as to face the substrate holder, and at least one electric field shielding body for shielding a part of an electric field from the anode to the substrate, wherein the electric field shielding body has three or more shielding members each having an opening portion for allowing the electric field from the anode to pass therethrough, and at least two of the shielding members are configured to be movable with respect to at least one of the shielding members so as to adjust an opening region formed by overlapping the respective opening portions.

DESCRIPTION OF EMBODIMENTS

Embodiments of a plating apparatus according to the present invention and an anode unit used in the plating apparatus will be described hereunder with reference to the accompanying drawings. In the accompanying drawings, the same or similar elements are represented by the same or similar reference signs, and duplicate descriptions of the same or similar elements in the description of each embodiment may be omitted. Further, features described with reference to each embodiment can be applied to the other embodiments as long as the embodiments do not contradict one another. In this specification, the term "substrate" includes not only a semiconductor substrate, a glass substrate, and a printed circuit board, but also a magnetic recording medium, a magnetic recording sensor, a mirror, an optical element, a micromechanical element, or a partially manufactured integrated circuit. The substrate includes substrates having any shapes (square, circle, etc.). In the present specification, expressions such as "front surface (side)", "rear surface (side)", "front", "back", "upper (up)", "lower (down)", "left", "right" and the like are used, and for convenience of description, these expressions represent positions and directions on the paper surfaces of the exemplified drawings, which may be changed depending on an actual arrangement when the apparatus is used.

Figure 1:
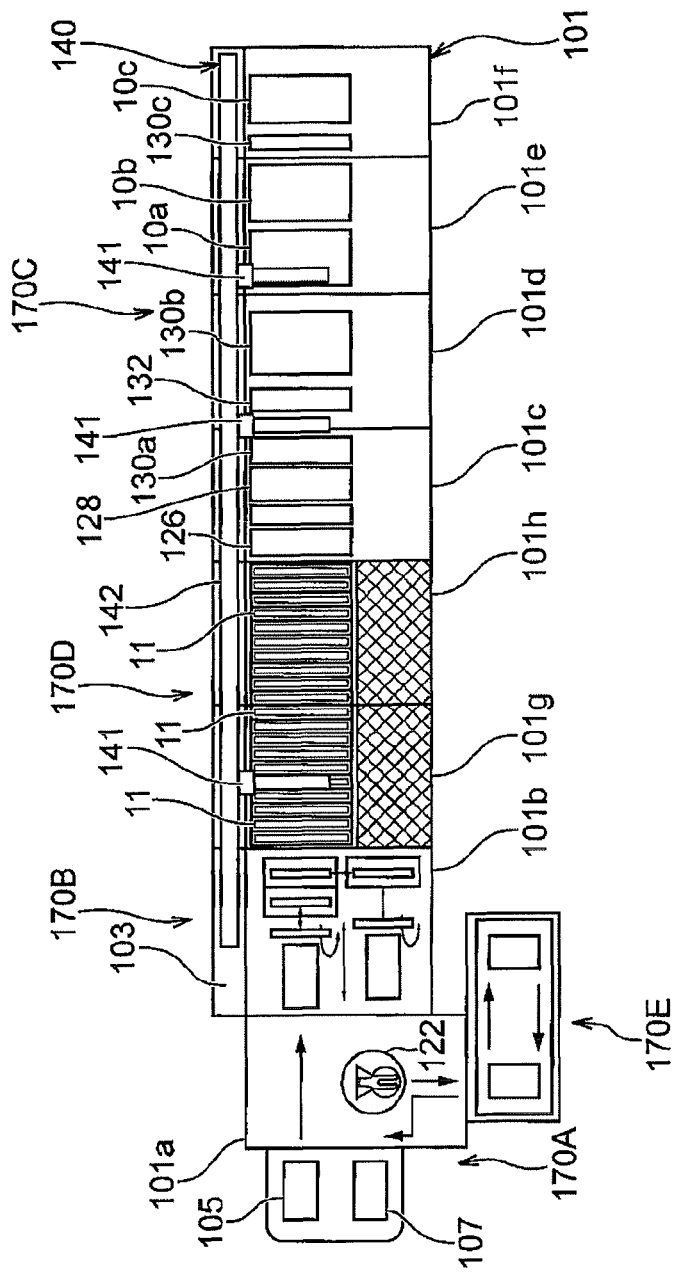
FIG. 1 is a schematic diagram showing an embodiment of a plating apparatus.

FIG. 1 is a schematic diagram showing an embodiment of a plating apparatus. As shown in FIG. 1, the plating apparatus includes a stand frame 101, a controller 103 for controlling the operation of the plating apparatus, a load/unload unit 170A for loading and unloading a substrate W (see FIG. 2), a substrate setting unit (machinery chamber, substrate mounting/demounting unit) 170B for setting a substrate W in a substrate holder 11 (see FIG. 2) and removing the substrate W from the substrate holder 11, a process unit (pre-processing chamber, plating chamber) 170C for performing plating on the substrate W, a holder stocking unit (stocker chamber) 170D for stocking substrate holders 11, and a washing unit 170E for washing and drying the plated substrate W. The plating apparatus according to the present embodiment is an electrolytic plating apparatus for plating a plating target surface of a substrate W with metal by making current flow through plating solution. Furthermore, a processing target substrate W in the present embodiment is a semiconductor package substrate or the like. In particular, the plating apparatus according to the present embodiment can be suitably used for rectangular substrates. A conductive layer including a seed layer or the like is formed on each of the front surface side and the back surface side of the substrate W. Furthermore, a resist layer is formed in a pattern surface forming region on the conductive layer, and trenches and vias are formed in the resist layer in advance. In the present embodiment, a substrate having a through-hole for connecting the front surface and the back surface of the substrate (so-called through-hole substrate) may be included as a processing target substrate.

As shown in FIG. 1, the stand frame 101 includes a plurality of stand frame members 101a to 101h, and these stand frame members 101a to 101h are configured to be connectable to one another. Components of the load/unload unit 170A are arranged on the first stand frame member 101a, components of the substrate setting unit 170B are arranged on the second stand frame member 101b, components of the process unit 170C are arranged on the third stand frame member 101c to the sixth stand frame member 101f, and components of the holder stocking unit 170D are arranged on the seventh stand frame member 101g and the eighth stand frame member 101h.

The load/unload unit 170A is provided with a load stage 105 on which a cassette (not shown) having a pre-plating substrate W accommodated therein is mounted, and an unload stage 107 on which a cassette (not shown) for receiving a substrate W plated in the process unit 170C is mounted. Further, a substrate transporting device 122 including a transporting robot for transporting a substrate W is arranged in the load/unload unit 170A.

The substrate transporting device 122 is configured to access a cassette mounted on the load stage 105, take out a pre-plating substrate W from the cassette, and deliver the substrate W to the substrate setting unit 170B. In the substrate setting unit 170B, the pre-plating substrate W is set on the substrate holder 11, and a plated substrate W is taken out from the substrate holder 11.

In the process unit 170C are arranged a pre-wet bath 126, a pre-soak bath 128, a first rinse bath 130a, a blow bath 132, a second rinse bath 130b, a first plating bath 10a, a second plating bath 10b, a third rinse bath 130c, and a third plating bath 10c. These baths 126, 128, 130a, 132, 130b, 10a, 10b, 130c, and 10c are arranged in this order. In the following description, the first plating bath 10a, the second plating bath 10b, and the third plating bath 10c may be referred to as the plating bath 10 collectively or when any plating bath out of these plating baths is referred to.

In the pre-wet bath 126, the substrate W is immersed in pure water as a pretreatment preparation. In the pre-soak bath 128, an oxide film on the surface of a conductive layer such as a seed layer formed on the surface of the substrate W is etched and removed with chemical liquid. In the first rinse bath 130a, the substrate W after the pre-soak is washed with cleaning solution (for example, pure water).

A plating target surface of a substrate W is plated in at least one plating bath of the first plating bath 10a, the second plating bath 10b, and the third plating bath 10c. Three plating baths 10 are provided in the embodiment shown in FIG. 1, but any number of plating baths 10 may be provided as another embodiment. A case where one surface of the substrate W is plated is exemplified below, but the present invention can also be applied in the case of a double-sided plating.

In the second rinse bath 130b, a substrate W which has been plated in the first plating bath 10a or the second plating bath 10b is washed together with the substrate holder 11 with cleaning solution (for example, pure water). In the third rinse bath 130c, a substrate W which has been plated in the third plating bath 10c is washed together with the substrate holder 11 with cleaning solution (for example, pure water).

In the blow bath 132, liquid draining of the washed substrate W is performed before and after the plating processing.

The pre-wet bath 126, the pre-soak bath 128, the rinse baths 130a to 130c, and the plating baths 10a to 10c are processing baths capable of storing processing solution (liquid) therein. Each of these processing baths has a plurality of processing cells for storing the processing solution therein. However, the present invention is not limited to this embodiment, and each of these processing baths may have a single processing cell. Furthermore, each of at least some of these processing baths may have a single processing cell, whereas each of the other processing baths may have a plurality of processing cells.

The plating apparatus further includes a transporting machine 140 for transporting the substrate holder 11. The transporting machine 140 is configured to be movable among the components of the plating apparatus. The transporting machine 140 includes a fixed base 142 extending in a horizontal direction from the substrate setting unit 170B to the process unit 170C, and a plurality of transporters 141 configured to be movable along the fixed base 142.

Each of these transporters 141 has a movable portion (not shown) for holding the substrate holder 11, and is configured to hold the substrate holder 11. The transporter 141 is configured to transport the substrate holder 11 among the substrate setting unit 170B, the holder stocking unit 170D, and the process unit 170C, and also move the substrate holder 11 up and down together with the substrate W. For example, one of the transporters 141 may move the substrate holder 11 holding the substrate W downwards from the upper side of the plating bath 10 to immerse the substrate W together with the substrate holder 11 in the plating solution inside the plating bath 10. For example, a combination of a motor and a rack and pinion may be available as a mechanism for moving the transporter 141. In the embodiment shown in FIG. 1, three transporters are provided, but any number of transporters may be adopted as another embodiment.

Configuration of Plating Bath

Figure 2:
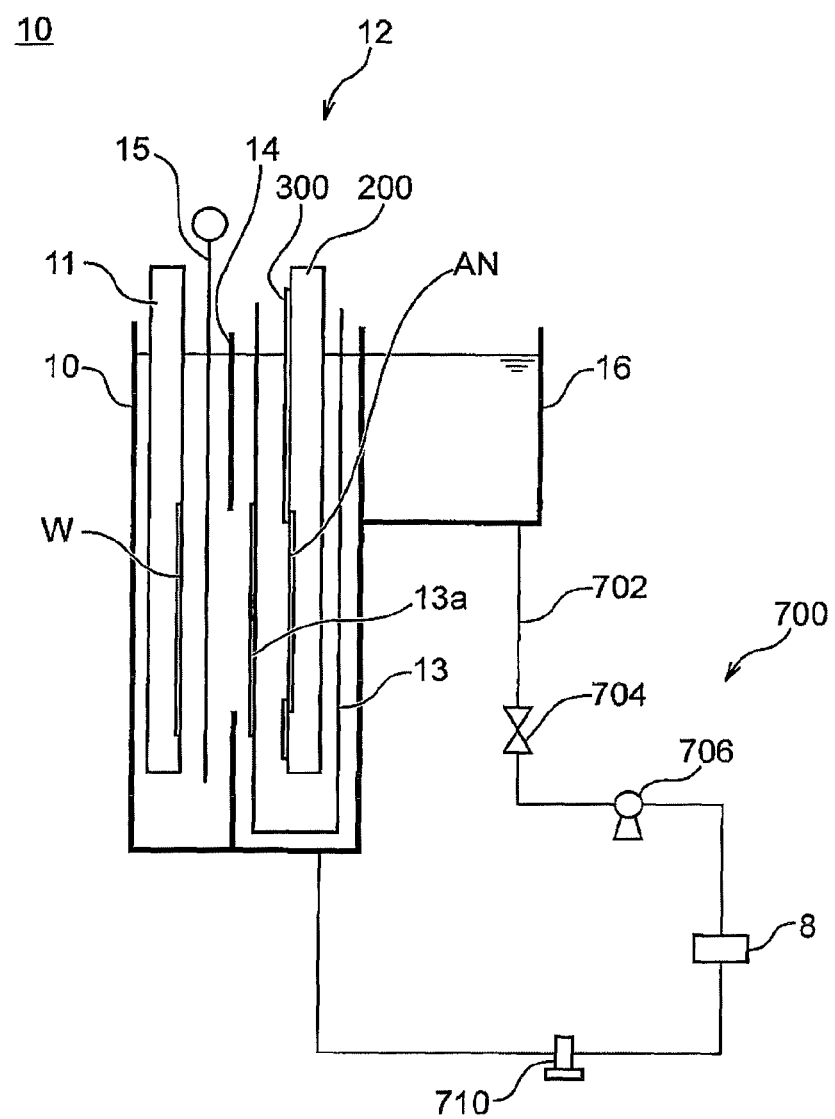
FIG. 2 is a side view schematically showing a configuration of a plating bath.

FIG. 2 is a side view schematically showing a configuration of the plating bath. During plating processing, the substrate holder 11 holding a substrate W, the anode unit 12 holding an anode electrode AN, a regulation plate 14, and a paddle 15 are arranged in the plating bath 10. The plating bath 10 accommodates plating solution therein, and the substrate W and the anode electrode AN are immersed in the plating solution. The anode unit 12 includes an anode holder 200 for holding the anode electrode AN, and an anode mask 300 for adjusting the electric field between the anode electrode AN and the substrate W. In one example, the anode unit 12 is accommodated in an anode box 13. An opening portion is provided at a position facing the anode electrode AN of the anode box 13, and a diaphragm 13a is disposed at the opening portion. The anode mask 300 includes one or more substantially plate-like members formed of, for example, a dielectric material. Details of the anode mask will be described later. The regulation plate 14 has an opening portion and adjusts the electric field between the anode electrode AN and the substrate W like the anode mask 300. In one example, the size of the opening portion of the regulation plate 14 is fixed, and regulation plates having different opening sizes are replaced and used. In another example, the opening size of the regulation plate 14 is adjustable. The paddle 15 agitates the plating solution in the vicinity of the plating target surface of the substrate W. The paddle 15 may be, for example, a substantially rod-like member, and may be provided in the plating bath 10 so as to be oriented in a vertical direction. The paddle 15 is configured to be horizontally movable along the plating target surface of the substrate W by a driving device (not shown). Furthermore, the paddle 15 may be configured by providing a plurality of longitudinal slits in a plate-like member. From the viewpoint of plating quality, it is preferable to satisfy the relation of (the exposed area or size of the plating target surface of the substrate W)>(the opening area or size of the regulation plate)>(the opening area or size of the anode mask). In this case, the area or size of the substrate W itself is larger than the area or size of the opening portion of the regulation plate. Accordingly, it is preferable that the opening area (or opening size) of the anode mask and the opening area (or opening size) of the regulation plate be set and/or adjusted so as to satisfy the above relationship.

The anode electrode AN is connected to an external power supply (not shown) via a wire in the anode holder 200. In addition, the plating target surface of the substrate W is connected to the external power supply via a wire in the substrate holder 11. When a voltage is supplied between the anode electrode AN and the substrate W from the external power supply, plating current flows along a passage passing from the external power supply through the anode electrode AN, the plating solution, and the seed layer on the plating target surface of the substrate W, and returning to the external power supply. As a result, metal in the plating solution is deposited on the plating target surface of the substrate W, thereby performing the plating processing on the substrate W.

The plating bath 10 is provided with a circulation mechanism 700 for circulating the plating solution between the plating bath 10 and an outer tank 16. The circulation mechanism 700 includes a circulation line 702 for connecting the plating bath 10 and the outer tank 16 for receiving the plating solution overflowing from the plating bath 10. In one example, the circulation line 702 is connected to a bottom portion of the plating bath 10 and a bottom portion of the outer tank 16. A valve 704 is provided in the circulation line 702, and is capable of opening and closing the circulation line 702. The valve 704 may be, for example, a solenoid valve, and the opening and closing of the circulation line 702 may be controlled by the controller 103 (see FIG. 1). A pump 706 is provided in the circulation line 702, and the plating solution can be circulated from the outer tank 16 into the plating bath 10 through the circulation line 702 by the pump 706. A temperature control device 708 is provided in the circulation line 702, and is capable of controlling the temperature of the plating solution passing through the circulation line 702. For example, a thermometer (not shown) may be provided in the plating bath 10, and the temperature control device 708 may be controlled by the controller 103 according to the temperature of the plating solution measured by this thermometer. A filter 710 is provided in the circulation line 702 to remove solid materials of the plating solution passing through the circulation line 702.

Anode Unit

First Embodiment

Figure 3:
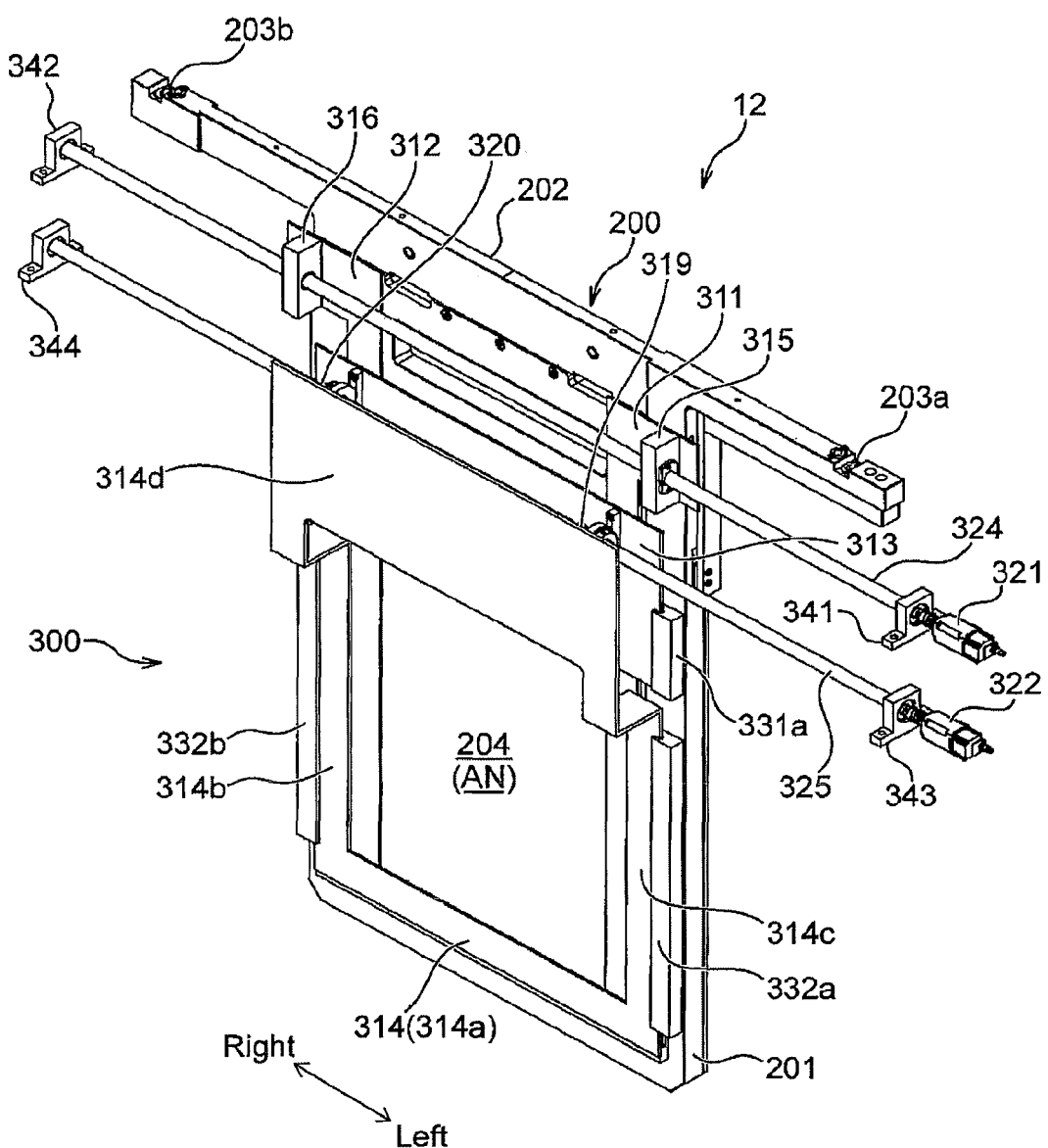
FIG. 3 is a perspective view of an anode unit according to a first embodiment.
Figure 4:
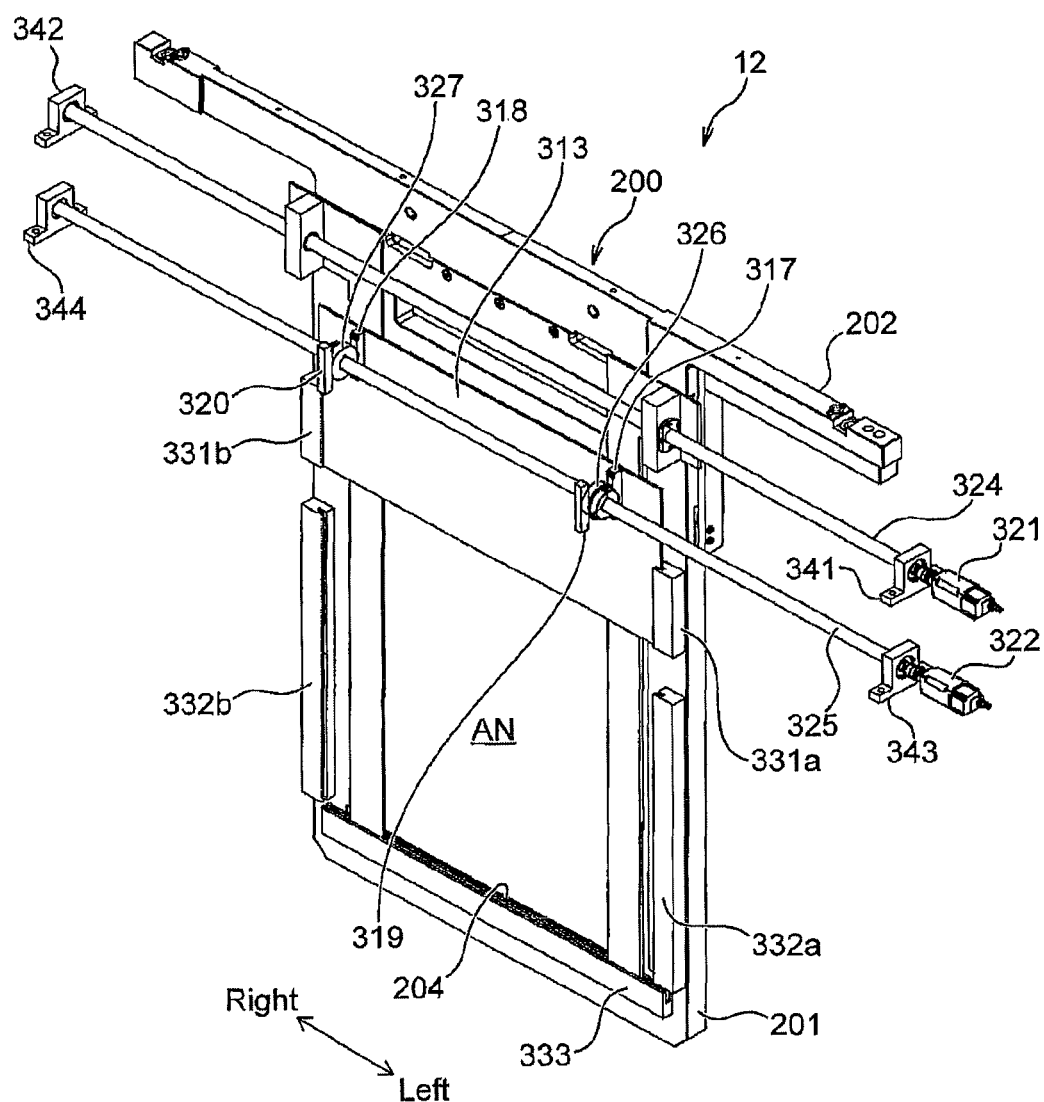
FIG. 4 is a perspective view of the anode unit according to the first embodiment with a lower mask being omitted.
Figure 5:
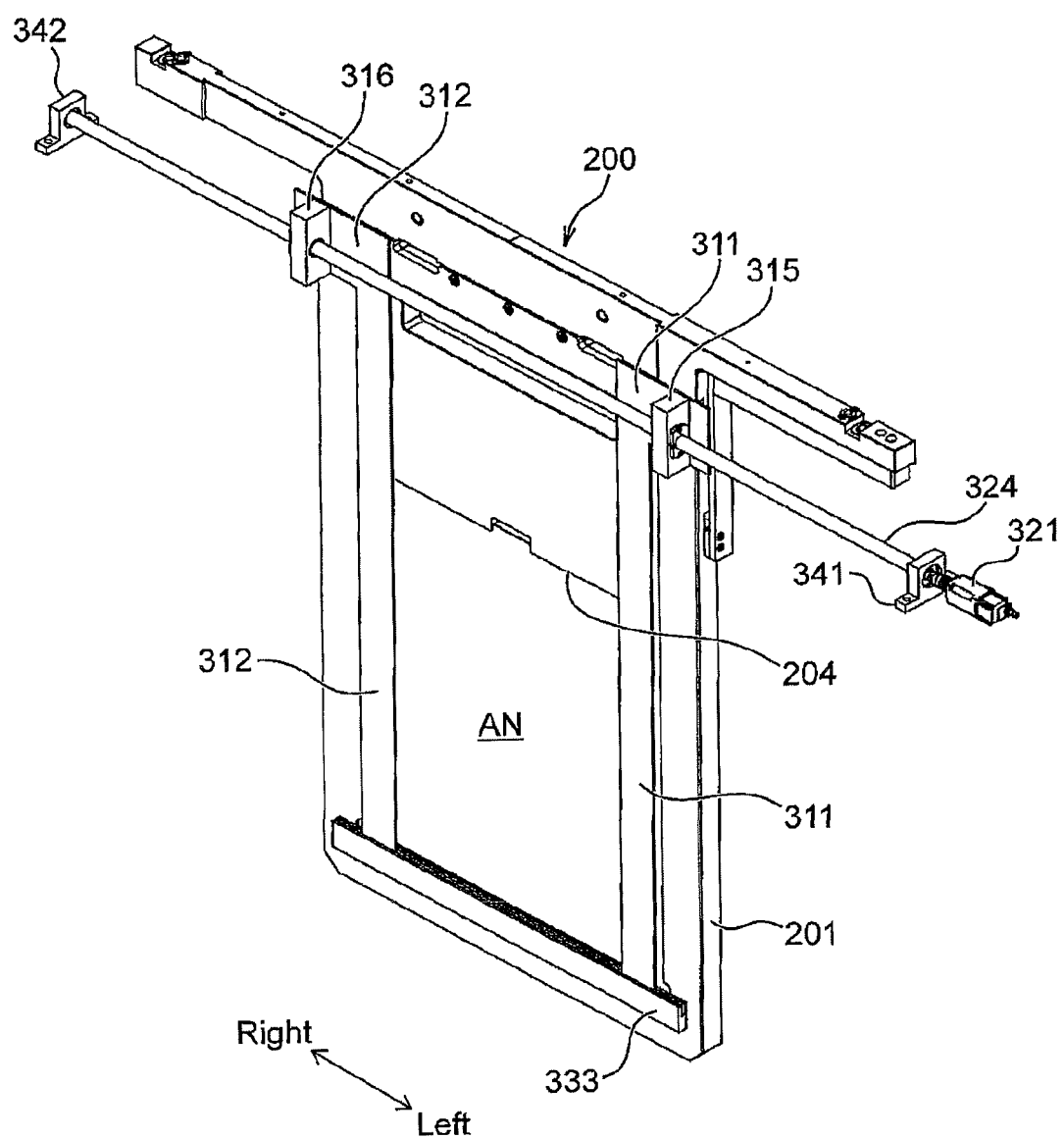
FIG. 5 is a perspective view of the anode unit according to the first embodiment with an upper portion and the lower mask being omitted.

FIG. 3 is a perspective view of an anode unit according to the first embodiment. FIG. 4 is a perspective view of the anode unit according to the first embodiment with a lower mask being omitted. FIG. 5 is a perspective view showing the anode unit according to the first embodiment with upper and lower masks of the anode unit being omitted.

The anode unit 12 includes the anode holder 200 for holding the anode electrode AN, and an anode mask 300 for adjusting an exposed region (opening region) of the anode electrode AN. The anode holder 200 includes an anode main body 201, and an arm portion 202. The anode mask 300 is integrally fitted to the front surface of the anode holder 200. The anode main body 201 has an opening portion 204. The anode main body 201 is configured to hold the anode electrode AN and expose the anode electrode AN from the opening portion 204. The arm portion 202 is configured to mount the anode holder 200 in the plating bath 10 at both end portions of the arm portion 202, and one end portion of the arm portion 202 is provided with a power supply terminal 203*a* which is electrically connected to an external power supply (not shown). When power is supplied to the anode electrode AN through two power supply paths, a power supply terminal 203*b* may be further provided to the other end portion of the arm portion 202. In the following description, a side of the anode unit (anode holder, anode mask) facing the substrate holder 11 will be referred to as a front side (front surface) of the anode unit (anode holder, anode mask), and the opposite side will be referred to as a rear side (back surface).

The anode mask 300 includes a left mask 311, a right mask 312, an upper mask 313, and a lower mask 314. The left mask 311, the right mask 312, the upper mask 313, and the lower mask 314 adjust the opening regions (opening size and opening position) of the opening portion 204 at a left-side end portion, a right-side end portion, an upper-side end portion and a lower-side end portion of the opening portion 204 of the anode main body 201, respectively. Each of the masks 311 to 314 is formed of, for example, a dielectric material.

As shown in FIG. 5, the left mask 311 is a substantially L-shaped plate-like member, and extends along the left-side end portion of the opening portion 204 of the anode main body 201. A guide 333 extending along the lower side at a lower portion of the opening portion 204 is provided on a front surface of the anode main body 201. A slit is provided inside the guide 333. A lower portion of the left mask 311 is engaged with the slit of the guide 333, and guided along a right and left direction by the guide 333. A guide member 315 is fitted to an upper portion of the left mask 311. Two or more guide members 315 may be provided. The guide member 315 may be fitted to the left mask 311 as another member or may be integrally formed with the left mask 311. The guide member 315 has a through-hole extending along the right and left direction of the anode main body 201, and a female screw is provided on the inner circumference of the through-hole. A female screw may be directly provided in the through-hole of the guide member 315, or another member which is provided with a through-hole having a female screw formed on the inner circumference thereof may be fitted to the guide member 315.

The right mask 312 is a substantially L-shaped plate-like member, and extends along a right-side end portion of the opening portion 204 of the anode main body 201. A lower portion of the right mask 312 is guided along the right and left direction by the guide 333. A guide member 316 is fitted to an upper portion of the right mask 312. The configuration of the guide member 316 is the same as that of the guide member 315.

A rod 324 extending in the right and left direction of the anode main body 201 is inserted in the through-holes of the guide members 315 and 316. A male screw is provided on the outer periphery of the rod 324. The male screw of the rod 324 is engaged with the female screw of the guide members 315 and 316 to constitute a feed screw mechanism. The rod 324 is supported by bearings 341 and 342, and one end of the rod 324 is connected to a rotation shaft of a motor 321. The female screw of the guide member 315 and the female screw of the guide member 316 are engaged with the male screw of the rod 324 so as to move in opposite directions along the axial direction of the rod 324 by rotation of the rod 324. In another embodiment, the female screw of the guide member 315 and the female screw of the guide member 316 may be engaged with the male screw of the rod 324 so as to move in the same direction along the axial direction of the rod 324 by rotation of the rod 324.

When the rod 324 is rotated by the motor 321, the guide members 315 and 316 move so as to approach or leave each other along the right and left direction, whereby the left mask 311 and the right mask 312 which are fixed to the guide members 315 and 316 move so as to approach or leave each other along the right and left direction. As a result, the opening regions at the left-side and right-side end portions of the opening portion 204 of the anode main body 201 are adjusted. In other words, the opening size in the right and left direction of the opening portion 204 is adjusted.

As shown in FIG. 4, the upper mask 313 extends along the upper side at the upper portion of the opening portion 204 of the anode main body 201. Guides 331a and 331b which are located outside the left side and the right side of the opening portion 204 and extend along the left side and the right side are provided on the front surface of the anode main body 201. Slits are provided inside the guides 331a and 331b. The left and right portions of the upper mask 313 are engaged with the slits of the guides 331a and 331b, and are guided so as to move along the up and down direction by the guides 331a and 331b. The upper mask 313 is provided with two rack gears 317 and 318. Each of the rack gears 317 and 318 has rack teeth. The rack gears 317 and 318 are provided at symmetrical positions in the right and left direction of the upper mask 313. The number of rack gears may be one or three or more. The rack gears 317 and 318 are engaged with two pinion gears 326 and 327 provided on the rod 325 extending in the right and left direction, respectively. Rack and pinion mechanisms are constituted by the rack gears 317 and 318 and the pinion gears 326 and 327. The rod 325 is supported by bearings 343 and 344, and one end of the rod 325 is connected to a rotation shaft of a motor 322. When the rod 325 is rotated by the motor 322, the upper mask 313 moves in the up and down direction by the rack and pinion mechanisms. As a result, the opening area at the upper-side end portion of the opening portion 204 of the anode main body 201 is adjusted.

The motors 321 and 322 are fixed to the plating bath 10. Although not shown in FIGS. 3 to 6B, the rod 324 may be divided into two parts between the guide member 315 and the bearing 341, and the two rods 324 may be connected to each other by a joint (see FIG. 13). Likewise, the rod 325 may be divided into two parts between the rack gear 317 and the bearing 343, and the two rods 325 may be connected to each other by a joint. The rods 324 and 325 on the side of the bearings 342 and 344 can also be configured likewise. In such a configuration, when maintenance of the anode unit 12, such as replacement of the anode electrode AN, is performed, the anode unit 12 can be removed from the plating bath 10 by releasing the connection between the rods through the joint.

As shown in FIG. 3, the lower mask 314 includes a lower mask portion 314a extending along the lower side of the opening portion 204 at the lower-side end portion of the opening portion 204 of the anode main body 201, a left extension portion 314b and a right extension portion 314c which extend along the left and right sides outside the left and right sides of the opening portion 204, and an upper extension portion 314d formed so as to connect the left extension portion 314b and the right extension portion 314c. The upper portions of the left extension portion 314b and the right extension portions 314c are bent in a direction away from the anode main body 201 so as to avoid interference with the upper mask 313, further bent so as to extend in a direction parallel to the anode main body 201, and connected to the upper extension portion 314d. In addition, the upper extension portion 314d is disposed at a position where the upper extension portion 314d avoids interference with the upper mask 313 in front view. In other words, when the anode unit 12 is viewed from the front side, the upper extension portion 314d is configured so as not to overlap the upper mask 313.

Guides 332a and 332b which are located outside the left side and the right side of the opening portion 204 and extend along the left side and the right side are provided on the front surface of the anode main body 201. Slits are provided inside the guides 332a and 332b. The left extension portion 314b and the right extension portion 314c are engaged with the slits of the guides 332a and 332b, and are guided so as to move along the up and down direction by the guides 332a and 332b. Rack gears 319 and 320 are provided on the back surface of the upper extension portion 314d of the lower mask 314 (FIGS. 3 and 4). The configurations of the rack gears 319 and 320 are the same as those of the rack gears 317 and 318. The rack gears 319 and 320 are engaged with the pinion gears 326 and 327, respectively. A rack and pinion mechanism is configured by the rack gears 319 and 320 and the pinion gears 326 and 327. When the rod 325 is rotated by the motor 322, the upper extension portion 314d is moved in the up and down direction by the rack and pinion mechanism, whereby the lower mask 314 moves along the guides 332a and 332b in the up and down direction. As a result, the opening region at the lower-side end portion of the opening portion 204 of the anode main body 201 is adjusted.

By the rack and pinion mechanism, the upper mask 313 and the lower mask 314 are moved in opposite directions along the up and down direction. The rack gears 317 and 318 of the upper mask 313 and the rack gears 319 and 320 of the lower mask 314 are engaged with the pinion gears 326 and 327 so as to move in opposite directions by rotation of the pinion gears 326 and 327. In another embodiment, the upper mask 313 and the lower mask 314 may be formed integrally with each other, and engaged with the rack and pinion mechanism so as to move in the same direction of the up and down direction by the rack and pinion mechanism.

According to the anode unit 12 described above, the left mask 311 and the right mask 312 are movable so as to approach or leave each other along the right and left direction, and the upper mask 313 and the lower mask 314 are moved so as to approach or leave each other along the up and down direction. As a result, it is possible to adjust the opening region in the right and left direction and the opening region in the up and down direction of the opening portion 204 of the anode holder 200 independently of each other. This makes it possible to more finely adjust the plating film thickness distribution on the substrate which is affected by the arrangement of a pattern to be plated on the substrate and/or by a method of supplying power to the substrate or the anode electrode.

Furthermore, since the left mask 311 and the right mask 312 move so as to approach or leave each other in synchronism with each other in the right and left direction, the opening regions at the right and left end portions of the opening portion 204 can be adjusted with the same amount. Furthermore, the opening regions at the right and left end portions of the opening portion 204 can be symmetrically adjusted. Likewise, since the upper mask 313 and the lower mask 314 move so as to approach or leave each other in synchronism with each other along the up and down direction, the opening regions at the upper and lower end portions of the opening portion 204 can be adjusted with the same amount. The opening regions at the upper and lower end portions of the opening portion 204 can be symmetrically adjusted. For example, under a state in which the substrate, the anode electrode and the opening portion 204 of the anode mask are arranged such that the centers of the respective members are located on a straight line, the adjustment can be performed so that each of the opening size in the right and left direction of the opening portion 204 and the opening size in the up and down direction of the opening portion 204 is optimum while the center of the opening portion is kept to be unmoved. Therefore, the method of adjusting the plating film thickness becomes simple, and dispersion in uniformity of the plating film thickness among the plating baths can be easily suppressed.

Modification of First Embodiment

Figure 6A:
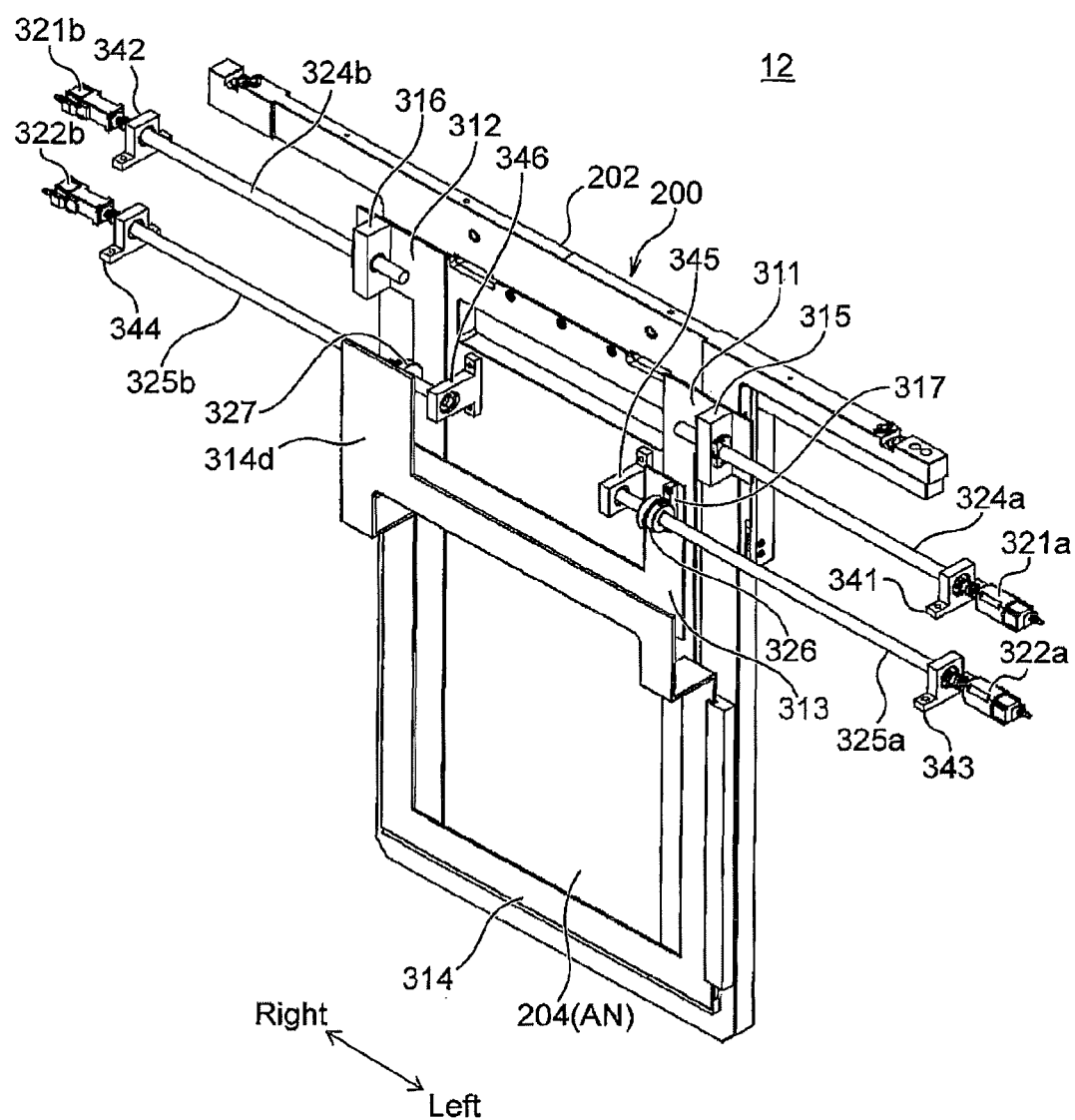
FIG. 6A is a perspective view of an anode unit according to a modification of the first embodiment when viewed from an upper right side of the anode unit.
Figure 6B:
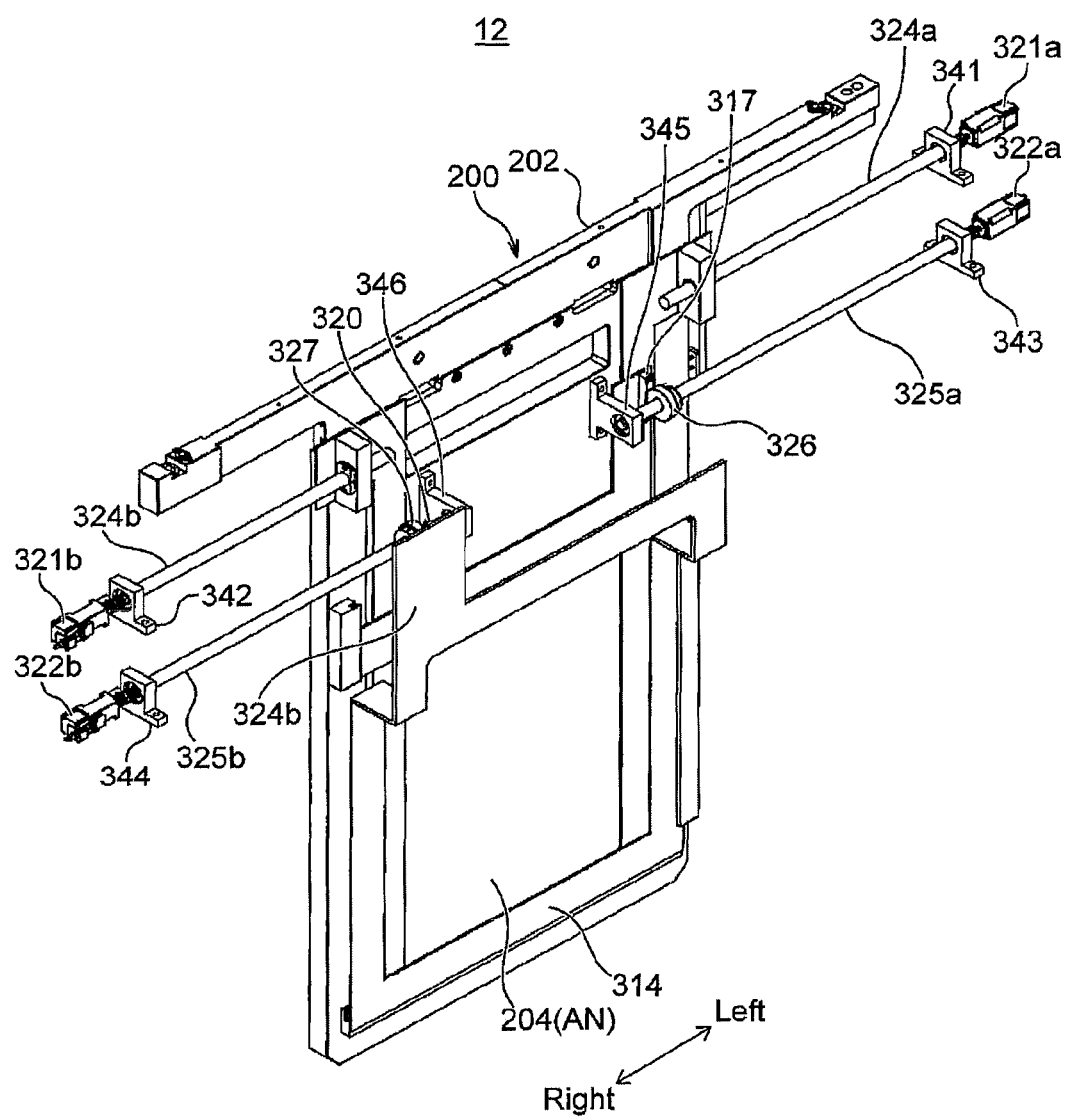
FIG. 6B is a perspective view of the anode unit according to the modification of the first embodiment when viewed from an upper left side of the anode unit.

FIG. 6A is a perspective view of an anode unit according to a modification of the first embodiment when the anode is viewed from the upper left side. FIG. 6B is a perspective view of the anode unit according to the modification of the first embodiment when the anode is viewed from the upper right side. In the anode unit 12 according to the modification, the left mask 311 and the right mask 312 are driven by independent driving mechanisms, and the upper mask 313 and the lower mask 314 are driven by independent driving mechanisms. The left mask 311 and the right mask 312 can be driven synchronously or asynchronously by the independent driving mechanisms. The left mask 311 and the right mask 312 can be driven to approach or leave each other, and can be driven to move in the same direction. The same is applied to the upper mask 313 and the lower mask 314.

As shown in FIGS. 6A and 6B, the rod 324 is divided into a rod 324a and a rod 324b, one end of the rod 324a is connected to a rotation shaft of a motor 321a, and one end of the rod 324b is connected to a rotation shaft of a motor 321b. The rod 324a is engaged with the guide member 315 of the left mask 311. The rod 324b is engaged with the guide member 316 of the right mask 312. Male screws are provided on the outer peripheries of the rod 324a and the rod 324b like the rod 324. The male screw on the outer periphery of the rod 324a and the female screw of the through-hole of the guide member 315 constitute a feed screw mechanism. The male screw on the outer periphery of the rod 324b and the female screw of the through-hole of the guide member 316 constitute a feed screw mechanism. The left mask 311 and the right mask 312 are movable in the right and left direction synchronously or asynchronously by the rotation of the motors 321a and 321b which are independent driving sources. The left mask 311 and the right mask 312 are movable in the right and left direction so as to approach or leave each other or move in the same direction by rotation of the motors 321a and 321b which are the independent driving sources.

As shown in FIGS. 6A and 6B, the rod 325 is divided into a rod 325a and a rod 325b. One end of the rod 325a is connected to a rotation shaft of a motor 322a, and one end of the rod 325b is connected to a rotation shaft of a motor 322b. The pinion gear 326 of the rod 325a is engaged with the rack gear 317 of the upper mask 313. The pinion gear 327 of the rod 325b is engaged with the rack gear 320 of the lower mask 314. The other end of the rod 325a is supported by a bearing 345 fitted to the anode holder 200. The other end of the rod 325b is supported by a bearing 346 fitted to the anode holder 200. A notch is provided at the right-side upper portion of the upper mask 313 to avoid interference with the bearing 346. A notch is provided at the left-side upper portion of the upper extension portion 314d of the lower mask 314 to avoid interference with the bearing 346.

The upper mask 313 and the lower mask 314 are movable in the up and down direction synchronously or asynchronously by the rotation of the motors 322a and 322b which are independent driving sources. The upper mask 313 and the lower mask 314 are movable along the up and down direction so as to approach or leave each other or move in the same direction by rotation of the motors 322a and 322b which are independent driving sources.

The motors 321a, 321b, 322a, and 322b are fixed to the plating bath 10. In addition, each of the rods 324a, 324b, 325a, and 325b may be split into two parts, and the parts may be connected by a joint. In this case, when maintenance of the anode unit 12, such as replacement of the anode electrode AN is performed, the anode unit 12 can be taken out from the plating bath 10 by releasing the connection of the rods by the joint.

According to the anode unit 12 of the modification, since the left mask 311 and the right mask 312 can be adjusted by different amounts and the upper mask 313 and the lower mask 314 can be adjusted by different amounts, the center position of the opening region can be adjusted. For example, when there is a misalignment between the center position of the substrate W and the center position of the anode mask, the misalignment can be corrected by adjusting the opening region of the anode mask. Furthermore, when there is a misalignment among the center positions of the substrate W, the regulation plate, and the anode mask, the misalignment can be corrected by adjusting the opening region of the anode mask. In addition, in the processing of a substrate in which the arrangement of a pattern to be plated is biased in the right and left direction or the up and down direction, it is also possible to adjust the electric field without moving the position of the anode mask itself. When an application example to the regulation plate described later is used, the opening region of the regulation plate can be also likewise adjusted, so that the accuracy of centering alignment can be further improved.

In the anode unit 12 according to the modification, under the control of the controller 103, the left mask 311 and the right mask 312 can be also synchronously adjusted and the upper mask 313 and the lower mask 314 can be also synchronously adjusted.

Application to Regulation Plate

Figure 25:
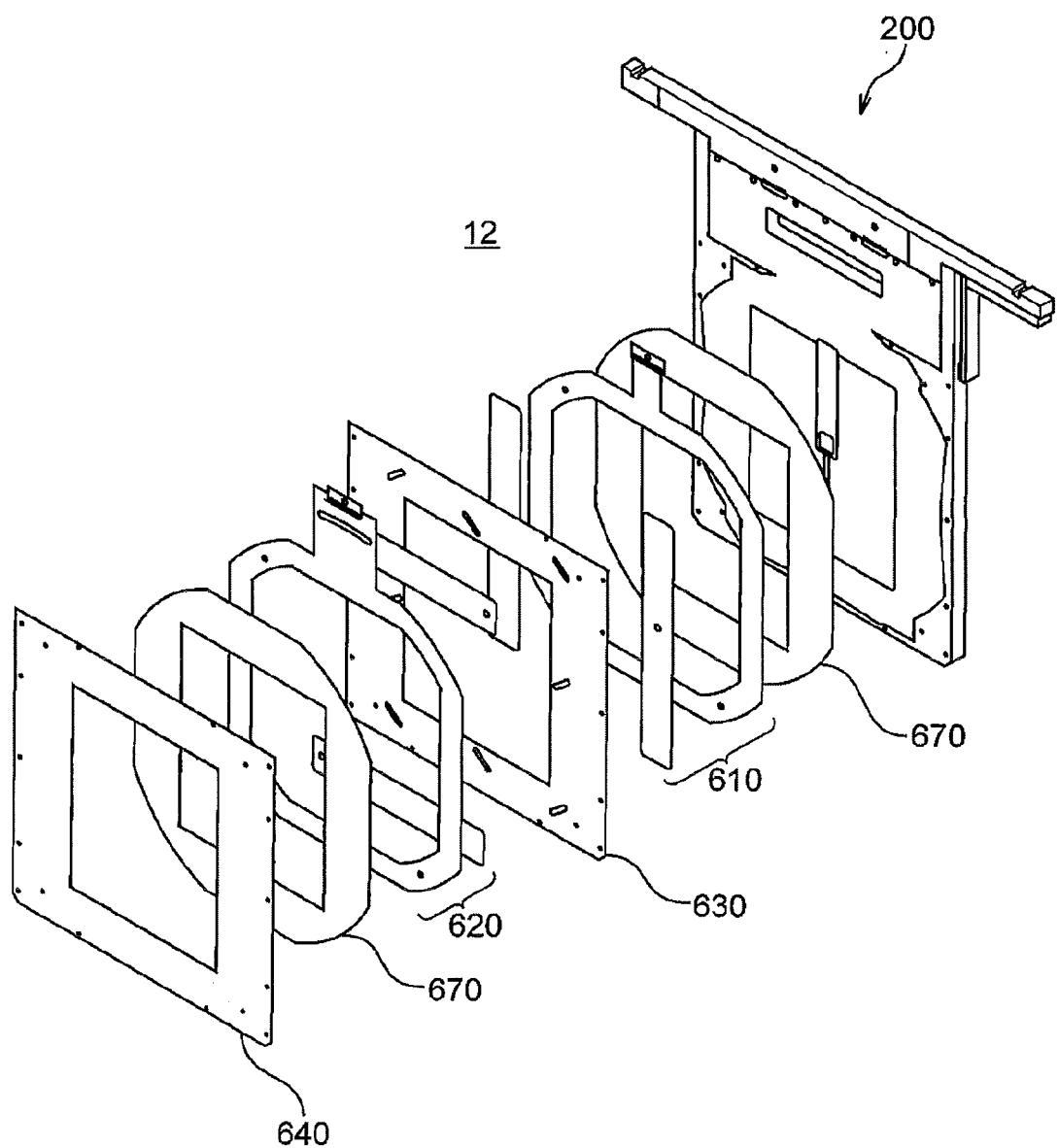
FIG. 25 is a modification of an anode holder according to the fourth embodiment.
Figure 26:
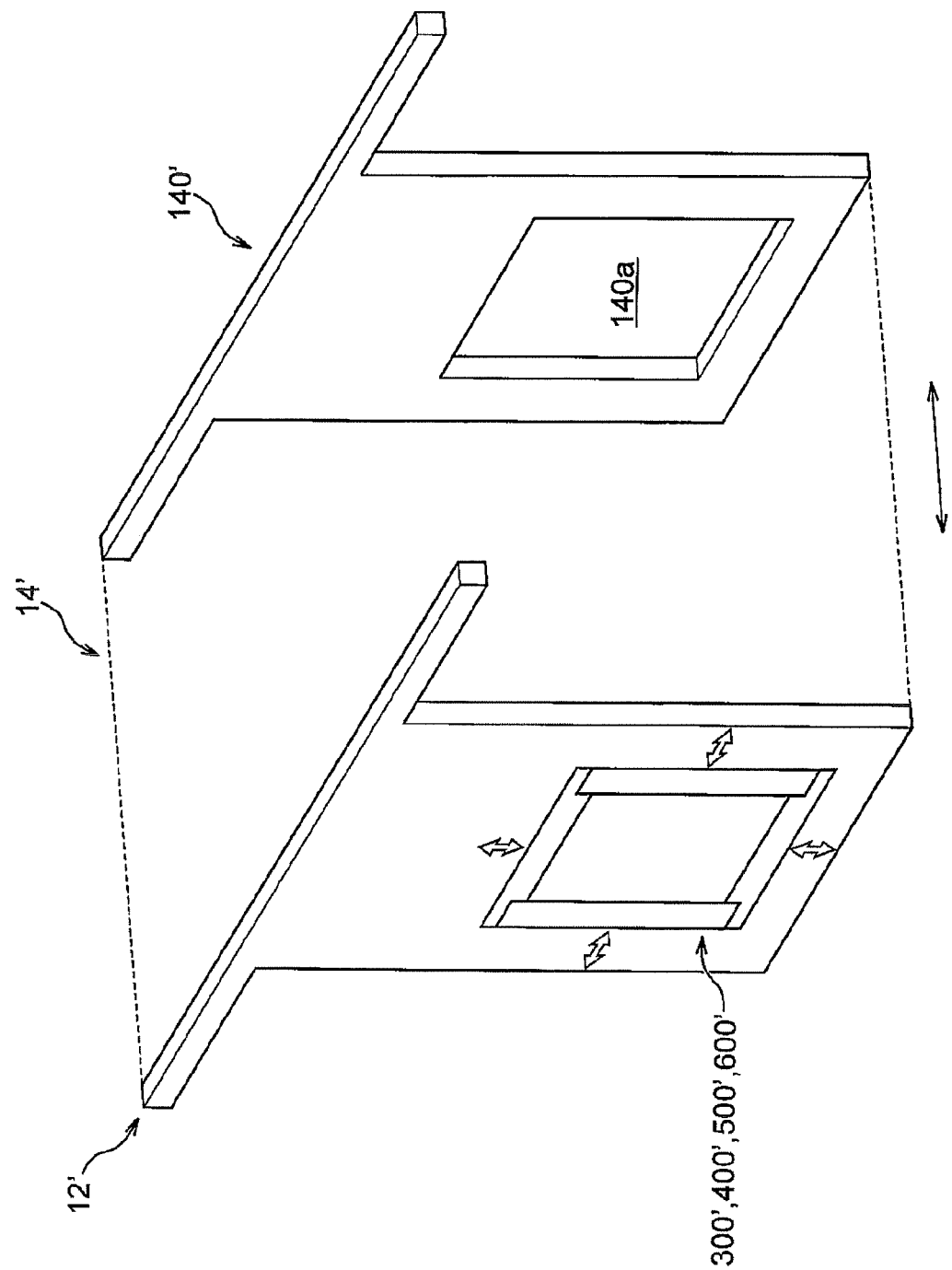
FIG. 26 is a perspective view of a regulation plate to which the present invention is applied.

FIG. 26 is a perspective view of a regulation plate to which the present invention is applied. The regulation plate 14' includes a base plate 140' and an adjustment plate 12'. The base plate 140' is a shielding plate having an opening portion 140a having a fixed opening area. The adjustment plate 12' is a plate having the same configuration as the anode mask 300 of the foregoing embodiment. The adjustment plate 12' has an opening portion penetrating therethrough like the anode mask 300, and the size, position or shape of the opening portion can be changed by a mechanism similar to that of the anode mask 300. As a result, the opening portion of the regulation plate which is slightly apart from the anode electrode and arranged between the substrate and the anode electrode is adjusted by a mechanism similar to that of the anode mask 300, whereby the electric field can be controlled. The adjustment plate 12' may have the same configuration as the anode mask according to each embodiment. For example, the adjustment plate 12' can adopt the configuration of an anode mask according to a second embodiment shown in FIGS. 7 to 9B described later, the configuration of an anode mask according to a third embodiment shown in FIGS. 10A to 12B, and the configuration of an anode mask according to a fourth embodiment shown in FIGS. 13 to 25. With such a configuration, in the adjustment plate 12', the opening region of the opening portion 140a of the base plate 140' can be adjusted by adjusting the position of each mask of the anode mask.

Since the anode mask is close to the anode electrode and far from the substrate, it is effective to control the film thickness of the entire plating surface of the substrate. On the other hand, the adjustment plate is closer to the substrate side than the anode mask, and thus the adjustment plate is relatively suitable for controlling the film thickness only at the outer peripheral portion of the substrate. By making both the anode mask and the adjustment plate independently variable in two directions, finer control of the plating film thickness can be performed, which is preferable.

A combined configuration of the base plate 140' having the opening portion 140a having a fixed opening area and the adjustment plate 12' having the same configuration as the anode mask 300 has been described with reference to FIG. 26. However, when shielding control of an electric field can be sufficiently performed, it is unnecessary to provide the base plate 140'. That is, only the adjustment plate 12' in which the opening area can be changed may be arranged between the substrate holder 11 and the anode unit 12 and used as a regulation plate. When the opening area of the regulation plate is made variable by using the adjustment plate 12', an anode mask having a fixed opening region may be used as the anode mask of the anode unit. Furthermore, when both the opening region of the regulation plate and the opening region of the anode mask are made variable, directions in which the opening sizes of the respective opening regions can be adjusted may be different from each other.

Adjustment Control of Anode Mask Opening Region

The movement control of each mask of the anode mask is executed by the controller 103. The controller 103 has a program for executing the movement control of each mask of the anode mask, or acquires it from an external memory or the like. For example, information on the opening region of the anode unit (anode mask) (for example, the position of each mask, the movement amount of the actuator) is stored in a memory or the like while included in items of a recipe. Then, the controller 103 reads a recipe item and controls the actuator based on the information of the opening region to adjust the opening region of the anode unit (anode mask). At this time, it is possible to independently control the opening sizes in the right and left direction and the up and down direction of the opening region by the actuator. The actuator can serve as any driving source such as a motor, a solenoid or an air cylinder. Furthermore, adjustment of the opening region of the anode unit (anode mask) may be performed before and during the plating processing. For example, it is possible to change the opening region for each type of substrate before the plating processing. Furthermore, it is also possible to adjust the area or size of the opening region (opening portion) during the plating processing. For example, on an early stage of the plating processing, the terminal effect acts strongly, and thus increase of the plating film thickness at the outer peripheral portion of the substrate can be prevented by making the opening region small. On a stage where the plating progresses to increase the plating film thickness as a whole, the terminal effect is alleviated and therefore the opening region can be broaden to further improve the uniformity of the plating film thickness. The regulation plate can be controlled in the same way. The adjustment of the opening region of the regulation plate can be likewise performed by the controller 103. The same is also applied to embodiments described below.

It is preferable that the opening region (or opening size) of the regulation plate, and the opening area (or opening size) based on the anode mask be adjusted so as to satisfy the relationship of (the area or size of the substrate)>(the opening area or size of the regulation plate)>(the opening area or size based on the anode mask). The same is also applied to the embodiments described below.

In the above embodiment, each mask may be manually moved without using any power from the actuator. In the other embodiments, each mask may be likewise manually moved without using any power from the actuator.

Second Embodiment

Figure 7:
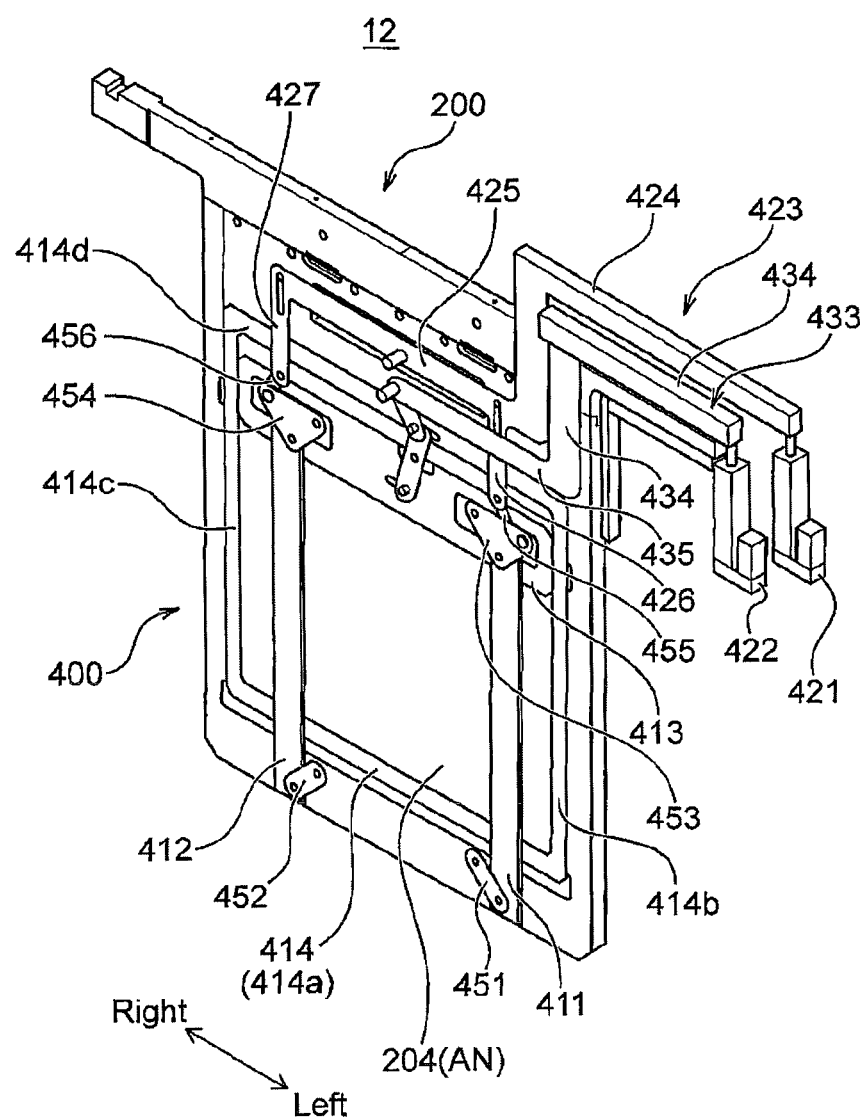
FIG. 7 is a perspective view showing an anode unit according to a second embodiment.
Figure 8:
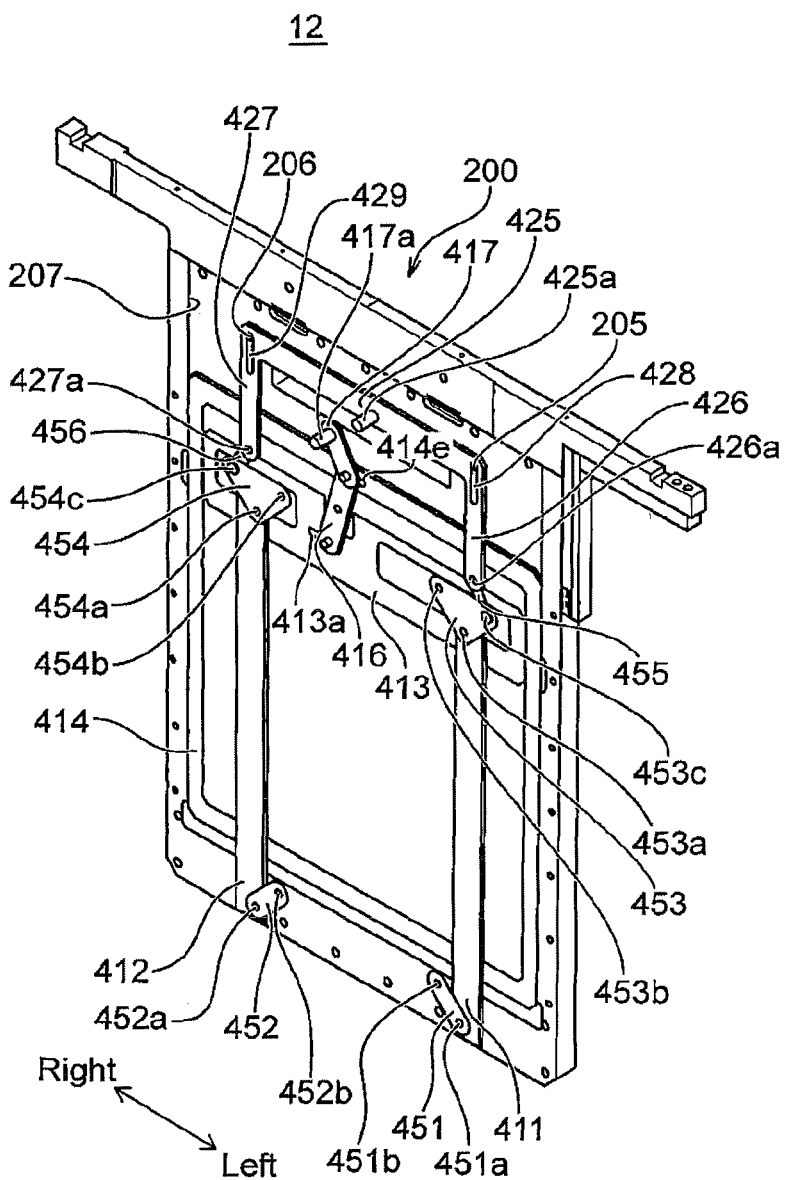
FIG. 8 is a perspective view of the anode unit according to the second embodiment with a driving unit being omitted.
Figure 9A:
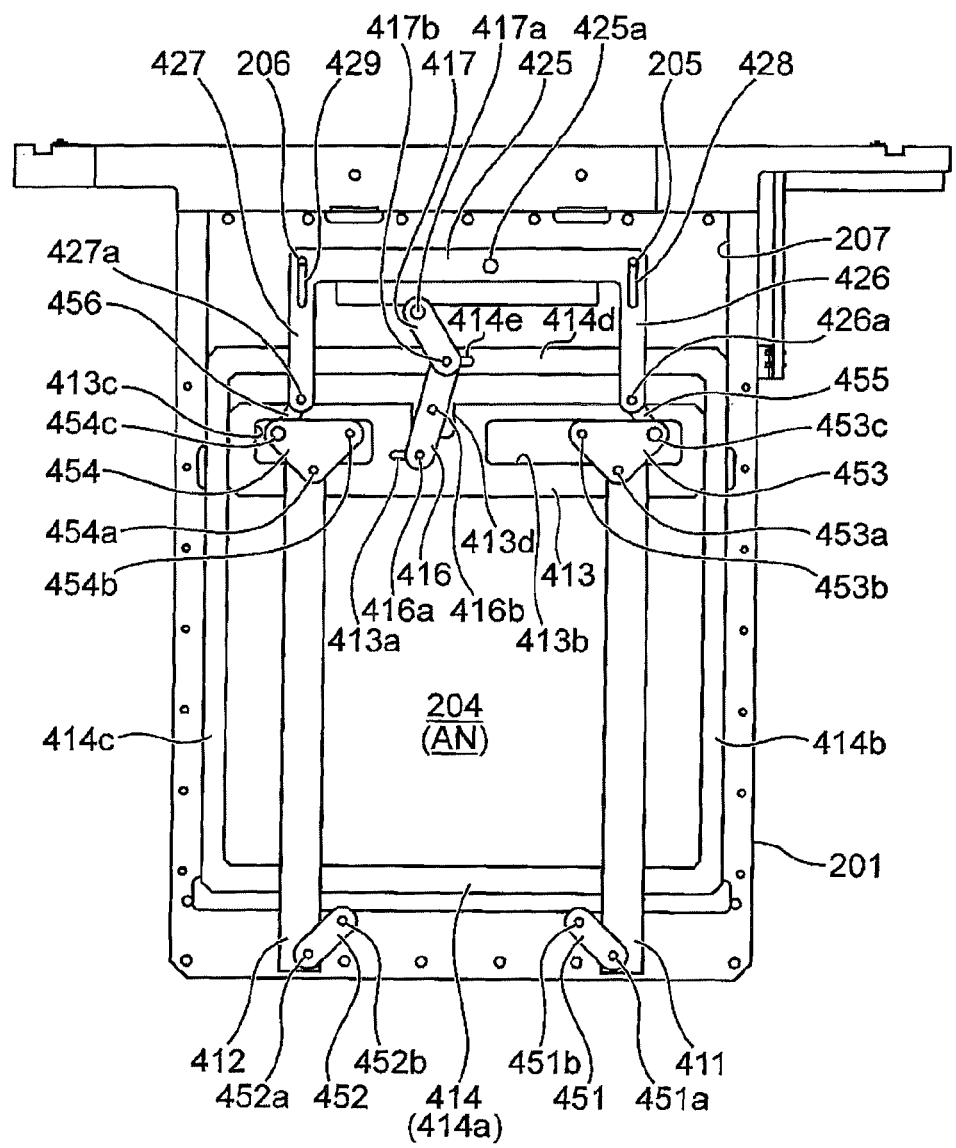
FIG. 9A is a front view of the anode unit according to the second embodiment under a first state.
Figure 9B:
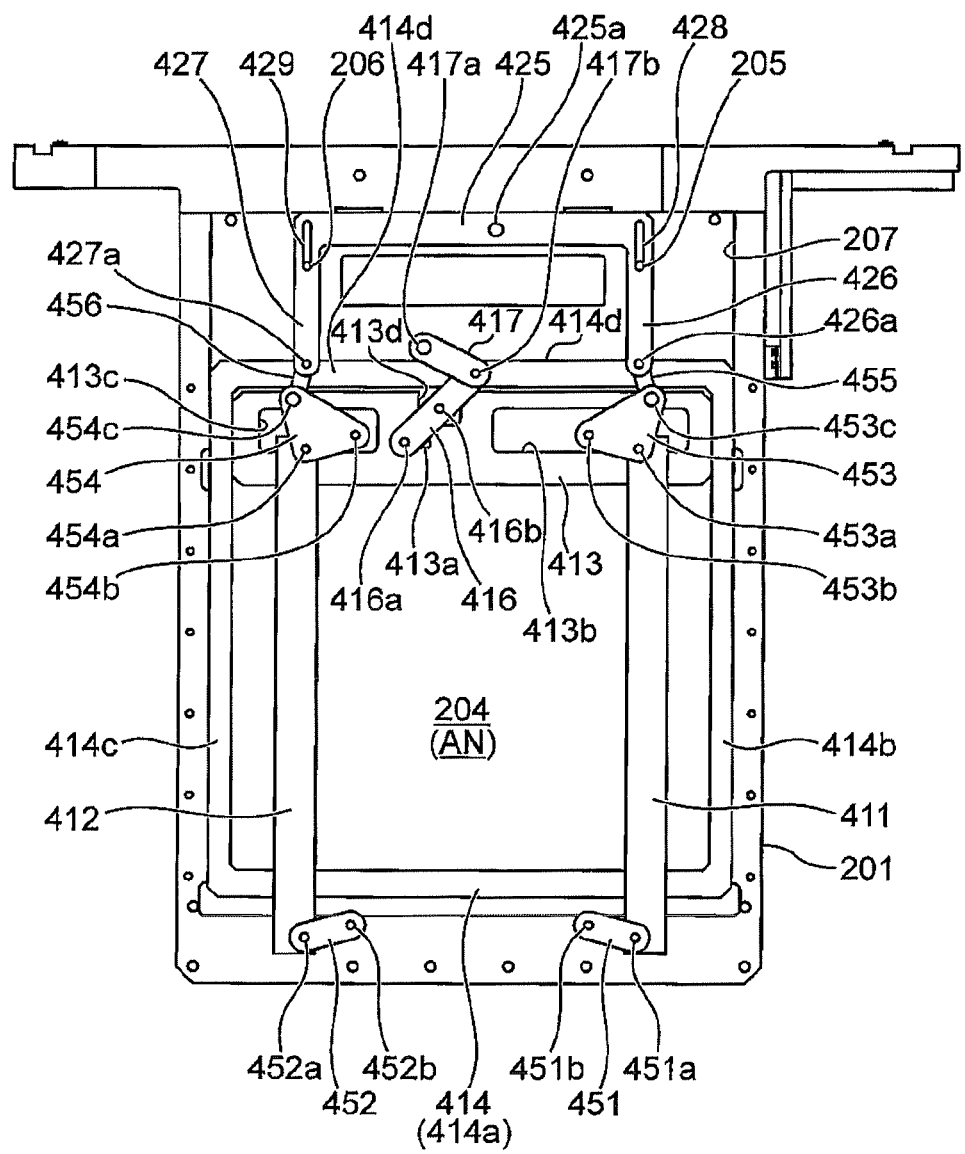
FIG. 9B is a front view of the anode unit according to the second embodiment under a second state.

FIG. 7 is a perspective view of an anode unit according to a second embodiment. FIG. 8 is a perspective view of the anode unit according to the second embodiment with a driving unit of the anode unit being omitted. FIG. 9A is a front view of the anode unit according to the second embodiment under a first state. FIG. 9B is a front view of the anode unit according to the second embodiment under a second state.

The anode unit 12 according to the present embodiment includes an anode holder 200 and an anode mask 400. Since the configuration of the anode holder 200 is substantially the same as that of the first embodiment, a detailed description thereof is omitted. As in the case of the first embodiment, when the anode holder and the anode mask are separately provided, the anode holder 200 can be used as a base plate for the anode mask 300.

The anode mask 400 includes a left mask 411, a right mask 412, an upper mask 413, and a lower mask 414. The left mask 411, the right mask 412, the upper mask 413, and the lower mask 414 respectively adjust the opening regions (opening sizes, etc.) of the opening portion 204 at a left-side end portion, a right-side end portion, an upper-side end portion, and a lower-side end portion of the opening portion 204 of the anode main body 201. Each of the masks 411 to 414 is made of, for example, a dielectric material.

The left mask 411 is a plate-like member, and extends along the left-side end portion of the opening portion 204 of the anode main body 201. The lower end portion of the left mask 411 is connected to the anode holder 200 via a link 451, and the upper end portion of the left mask 411 is connected to the anode holder 200 via a link 453. The lower end portion of the left mask 411 is rotatably connected to one end portion of the link 451 by a pin 451a. The other end portion of the link 451 is rotatably connected to the anode holder 200 by a pin 451b. In the present embodiment, the link 453 has a roughly triangular shape, but may have other shapes. The upper end portion of the left mask 411 is rotatably connected to the link 453 by a pin 453a. The link 453 is rotatably connected to the anode holder 200 by a pin 453b. Further, the link 453 is connected to one end of a moving member 425 via a link 455. The link 455 is rotatably connected to the link 453 by a pin 453c and is rotatably connected to one end of the moving member 425 by a pin 426a.

The right mask 412 is a plate-like member and extends along the right-side end portion of the opening portion 204 of the anode main body 201. The lower end portion of the right mask 412 is connected to the anode holder 200 via a link 452, and the upper end portion of the right mask 412 is connected to the anode holder 200 via a link 454. The lower end portion of the right mask 412 is rotatably connected to one end portion of the link 452 by a pin 452a. The other end of the link 452 is rotatably connected to the anode holder 200 by a pin 452b. In the present embodiment, the link 454 has a substantially triangular shape, but may have other shapes. The upper end portion of the right mask 412 is rotatably connected to the link 454 by a pin 454a. The link 454 is rotatably connected to the anode holder 200 by a pin 454b. Furthermore, the link 454 is connected to one end of the moving member 425 via a link 456. The link 456 is rotatably connected to the link 454 by a pin 454c and is rotatably connected to one end of the moving member 425 by a pin 427a.

The moving member 425 has vertical sides 426 and 427 extending in the up and down direction, and is configured so that the upper ends of the vertical sides 426 and 427 are connected to each other. Guide grooves 428 and 429 are provided in the vertical sides 426 and 427, respectively. Guide pins 205 and 206 provided to the anode holder 200 are engaged with the guide grooves 428 and 429, respectively. The movement in the up and down direction of the moving member 425 is guided along the guide grooves 428 and 429 by the guide pins 205 and 206. A handle 425a is provided at substantially a center portion of a connecting portion of the vertical sides 426 and 427 of the moving member 425. The handle 425a is used when the left mask 411 and the right mask 412 are manually moved.

As shown in FIG. 7, the moving member 425 is connected to a moving member 424. In the present embodiment, the moving member 424 extends upward from the connecting portion with the moving member 425, and then extends leftward along the right and left direction. The configuration of the moving member 424 is an example, and other configurations may be adopted. The left-side end portion of the moving member 424 is positioned such that the output shaft of the actuator 421 can abut against the left-side end portion. The actuator 421 is capable of moving the moving member 424 in the up and down direction. The actuator 421 is fixed to the plating bath 10, and includes, for example, a motor and a rotation/rectilinear motion converting mechanism (ball screw mechanism, ball ramp mechanism or the like) for converting rotation of the motor into a rectilinear motion. The actuator 421 may be another driving source such as a solenoid, an air cylinder or the like.

When the moving members 424 and 425 are moved upward by the actuator 421 at the position (first state) of the left mask 411 in FIG. 9A, the link 453 is pulled up through the link 455 by the moving member 425 as shown in FIG. 9B (second state), and the link 453 is counterclockwise rotated around the pin 453b. Although the left mask 411 also tries to rotate due to the rotation of the link 453, the left mask 411 translates leftward while moving upward because the lower end portion of the left mask 411 is connected to the anode holder 200 via the link 451. The right mask 412 likewise moves from the position (first state) in FIG. 9A to the position (second state) in FIG. 9B. However, since the rotation direction of the link 454 is opposite to the rotation direction of the link 453, the right mask 412 moves rightward. As a result, the left mask 411 and the right mask 412 are moved so as to approach each other. Furthermore, when the moving members 424 and 425 are moved downward by the actuator 421, the links 453 and 454 rotate in opposite directions, and the left mask 411 and the right mask 412 move in a direction to leave each other. As described above, the left mask 411 and the right mask 412 are moved so as to approach or leave each other along the right and left direction in synchronism with each other via the moving member 425. As a result, the opening regions at the left-side end portion and the right-side end portion of the opening portion 204 of the anode main body 201 are adjusted according to the movement amounts of the left mask 411 and the right mask 412.

When the moving members 424 and 425 are moved in the up and down direction by the actuator 421, the links 453 and 454 rotate around the pins 453b and 454b, and this rotation of the links 453 and 454 is converted to the movement in the right and left direction of the left mask 411 and the right mask 412. As a result, the opening regions (the opening size in the right and left direction) at the left-side end portion and the right-side end portion of the opening portion 204 of the anode main body 201 are adjusted.

By setting the rotation directions of the links 453 and 454 to the same direction, the left mask 411 and the right mask 412 may be moved in the same direction. In this case, it is possible to shift the center of the opening region of the opening portion 204 in the right and left direction with changing the opening area or without changing the opening area.

The upper mask 413 extends along the upper side at the upper-side end portion of the opening portion 204 of the anode main body 201. For example, the upper mask 413 is arranged so that the lower side of the upper mask 413 overlaps the upper side of the opening portion 204 or is located outside the upper side of the opening portion under the second state of FIG. 9B. The upper mask 413 is provided with an opening portion 413b for releasing the pin 453b of the link 453, an opening portion 413c for releasing the pin 454b of the link 454, and an opening portion 413d for releasing the pin 416b of the link 416. The upper mask 413 is provided with an elongated hole 413a. The upper mask 413 is connected to one end of the link 416 by engaging a pin 416a with the elongated hole 413a. The pin 416a is movable along the elongated hole 413a. An intermediate part of the link 416 is rotatably connected to the anode holder 200 by the pin 416b. The other end portion of the link 416 is connected to an elongated hole 414e provided in the upper extension portion 414d of the lower mask 414 together with one end portion of a link 417 by a pin 417b (FIG. 9A). The pin 417b is movable along the elongated hole 414e. A handle 417a is provided at the other end portion of the link 417. The handle 417a is used when the upper mask 413 and the lower mask 414 are manually moved.

The lower mask 414 is a frame-like member. The lower mask 414 includes a lower mask portion 414a extending along the lower side of the opening portion 204 at the lower-side end portion of the opening portion 204 of the anode main body 201, a left extension portion 414b and a right extension portion 414c which extend along the left side and the right side outside the left side and the right side of the opening portion 204 respectively, and an upper extension portion 414d formed so as to connect the left extension portion 414b and the right extension portion 414c to each other. The lower mask 414 is arranged in the anode holder 200 such that a region where the lower mask portion 414a overlaps the opening portion 204 under the first state (FIG. 9A) is maximum, and a region where the lower mask portion 414a overlaps the opening portion 204 under the second state (FIG. 9B) is minimum (containing zero). For example, the lower mask 414 is arranged such that under the second state of FIG. 9B, the upper side of the lower mask portion 414a of the lower mask 414 overlaps the lower side of the opening portion 204 or is located outside the lower side of the opening portion 204. The elongated hole 414e is provided in the upper extension portion 414d, and the pin 417b for rotatably supporting the links 416 and 417 is engaged with the elongated hole 414e. A guide portion 207 is provided on the front side of the anode main body 201. In the present embodiment, the guide portion 207 is configured as a concave portion provided in the anode main body 201. The guide portion 207 may be configured by fitting another member to the anode main body 201 or combining the concave portion of the anode main body 201 with another member. The left extension portion 414b and the right extension portion 414c of the lower mask 414 are guided along the up and down direction by the side wall of the guide portion 207. The movement in the up and down direction of the upper mask 413 is guided by the inner surfaces of the left extension portion 414b and the right extension portion 414c of the lower mask 414.

As shown in FIG. 7, one end of a moving member 435 is connected to the upper end portion of the link 417. In the present embodiment, the moving member 435 is a plate-like member extending along the upper side of the opening portion 204, and a moving member 434 is connected to the other end of the moving member 435. In the present embodiment, the moving member 434 extends upward from the connecting portion with the moving member 435, and then extends leftward along the right and left direction. The configurations of the moving members 434 and 435 are examples, and other configurations may be adopted. The left-side end portion of the moving member 434 is positioned so that the output shaft of the actuator 422 can abut against the left-side end portion of the moving member 434. The actuator 422 is capable of moving the moving member 434 in the up and down direction. The actuator 422 is fixed to the plating bath 10, and includes, for example, a motor and a rotation/rectilinear motion converting mechanism (a ball screw mechanism, a ball ramp mechanism or the like) for converting rotation of the motor into a rectilinear motion. The actuator 422 may be another driving source such as a solenoid or an air cylinder.

When the moving members 434 and 435 are moved downward by the actuator 422 at the positions (the first state) of the upper mask 413 and the lower mask 414 in FIG. 9A, as shown in FIG. 9B (second state), the link 417 moves downward, and the pin 417b moves downward while moving leftward within the elongated hole 414e, thereby moving the upper extension portion 414d of the lower mask 414 downward. Furthermore, the downward movement of the pin 417b causes the link 416 to rotate clockwise around the pin 416b, and the pin 416a moves upward while moving rightward within the elongated hole 413a, thereby moving the upper mask 413 upward. As a result, the upper mask 413 and the lower mask 414 (the lower mask portion 414a) move synchronously so as to leave each other in the up and down direction. That is, since the upper mask 413 moves upward and the lower mask 414 moves downward, the opening regions at the upper-side end portion and the lower-side end portion of the opening portion 204 are enlarged.

When the moving members 434 and 435 are moved upward by the actuator 422 at the positions (the second state) of the upper mask 413 and the lower mask 414 in FIG. 9B, as shown in FIG. 9A (first state), the link 417 moves upward, and the pin 417b moves upward while moving rightward within the elongated hole 414e, thereby moving the upper extension portion 414d of the lower mask 414 upward. Furthermore, the upward movement of the pin 417b causes the link 416 to rotate counterclockwise around the pin 416b, and the pin 416a moves downward while moving leftward in the elongated hole 413a, thereby moving the upper mask 413 downward. As a result, the upper mask 413 and the lower mask 414 (the lower mask portion 414a) move synchronously so as to approach each other along the up and down direction. That is, since the upper mask 413 moves downward and the lower mask 414 moves upward, the opening regions at the upper-side end portion and the lower-side end portion of the opening portion 204 are reduced.

The upper mask 413 and the lower mask 414 move synchronously so as to approach or leave each other along the up and down direction, whereby the opening regions at the upper-side end portion and the lower-side end portion of the opening portion 204 of the anode main body 201 are adjusted according to the movement amounts of the upper mask 413 and the lower mask 414.

The first state (FIG. 9A) represents a state where the left mask and the right mask approach each other most closely, and the upper mask and the lower mask approach each other most closely. The second state (FIG. 9B) represents a state where the left mask and the right mask leave each other most distantly, and the upper mask and the lower mask leave each other most distantly. The movement of the left mask and the right mask and the movement of the upper mask and the lower mask are independently adjustable by independent actuators 421 and 422 or manually.

According to the anode unit 12 described above, the left mask 411 and the right mask 412 are movable so as to approach or leave each other along the right and left direction, and the upper mask 413 and the lower mask 414 are movable so as to approach or leave each other along the up and down direction. As a result, the opening region in the right and left direction of the opening portion 204 of the anode holder 200 and the opening region in the up and down direction of the opening portion 204 of the anode holder 200 can be adjusted independently of each other.

Furthermore, since the left mask 411 and the right mask 412 move so as to approach or leave each other synchronously in the right and left direction, the opening regions at the right and left end portions of the opening portion 204 can be adjusted with the same amount. In addition, the opening regions at the right and left end portions of the opening portion 204 can be symmetrically adjusted. Likewise, since the upper mask 413 and the lower mask 414 move so as to approach or leave each other synchronously along the up-and-left direction, the opening regions at the upper and lower end portions of the opening portion 204 can be adjusted with the same amount. In addition, the opening regions at the upper and lower end portions of the opening portion 204 can be symmetrically adjusted.

The link mechanism may be configured so that the upper mask 413 and the lower mask 414 move in the same direction. In this case, it is possible to shift the center of the opening region of the opening portion 204 in the up and down direction with changing the opening area or without changing the opening area. Furthermore, the upper mask 413 and the lower mask 414 may be moved by independent driving sources. That is, the above-described mechanism for moving the upper mask 413 and the lower mask 414 may be independently provided for each of the upper mask 413 and the lower mask 414.

When the link mechanism is configured so that the left mask 411 and the right mask 412 are moved in the same direction and adjusted (for example, the links 453 and 454 are independently driven), it is possible to shift the center of the opening region of the opening portion 204 in the right and left direction with changing the opening area or without changing the opening area. Furthermore, the left mask 411 and the right mask 412 may be moved by independent driving sources.

Each mask may be manually moved by using no power from the actuator.

The configuration of the anode mask according to the second embodiment can also be applied to the regulation plate as described with reference to the first embodiment. In addition, the opening regions of the anode mask and the regulation plate according to the second embodiment can also be adjusted by the controller as in the case of the first embodiment.

Third Embodiment

Figure 10A:
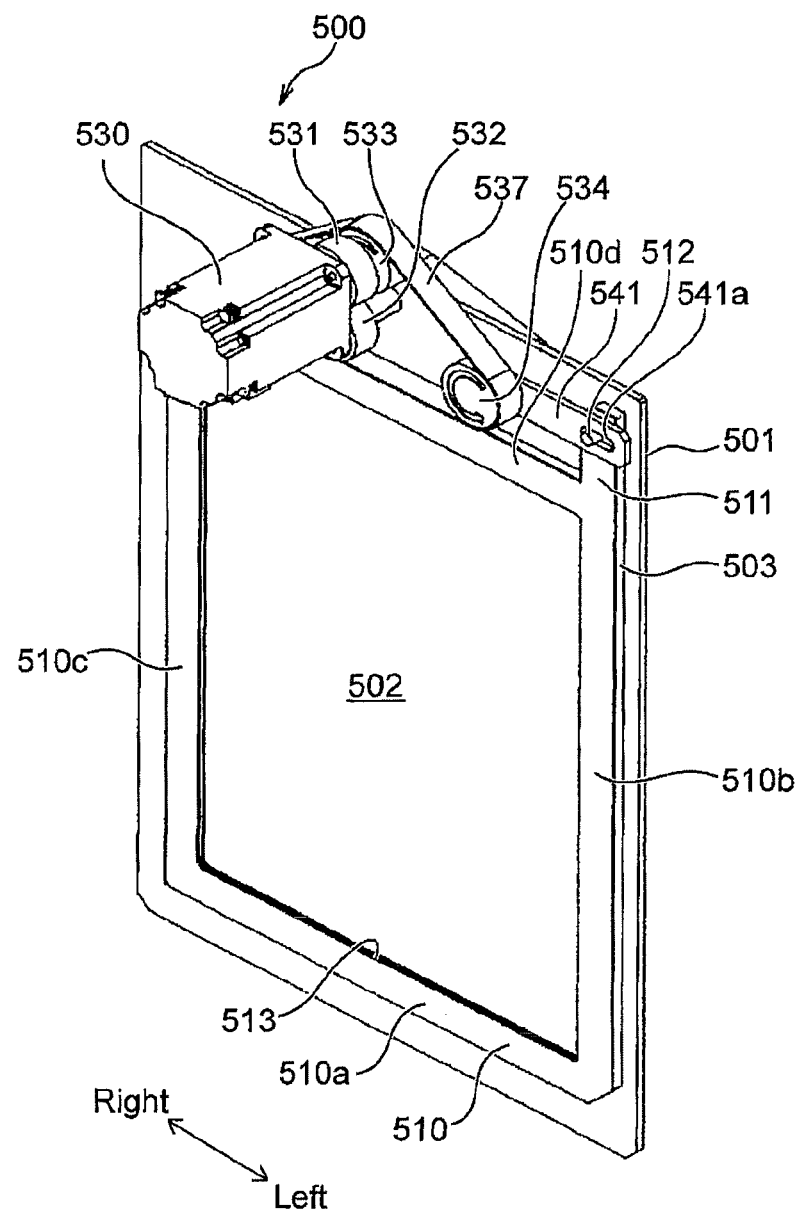
FIG. 10A is a perspective view of an anode mask of an anode unit according to a third embodiment when viewed from a front side of the anode mask.
Figure 10B:
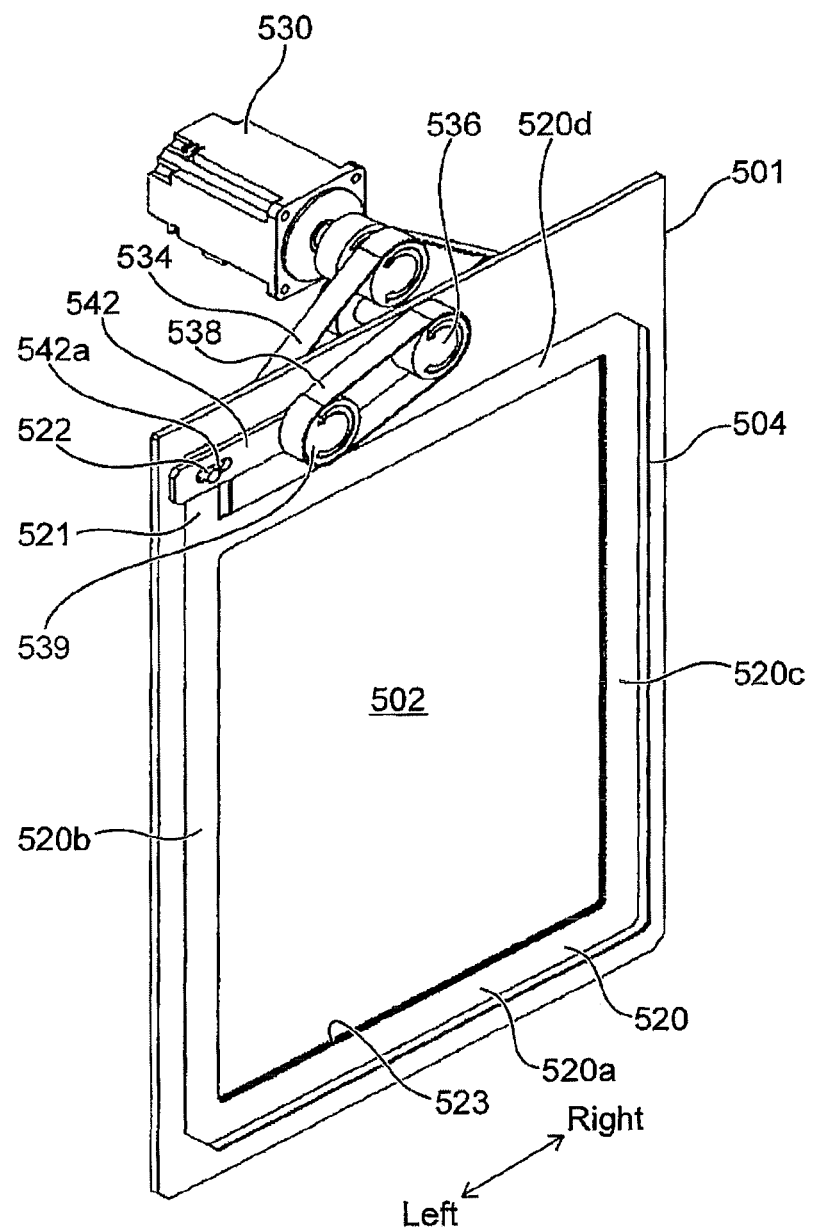
FIG. 10B is a perspective view of the anode mask of the anode unit according to the third embodiment when viewed from a back side of the anode mask.
Figure 10C:
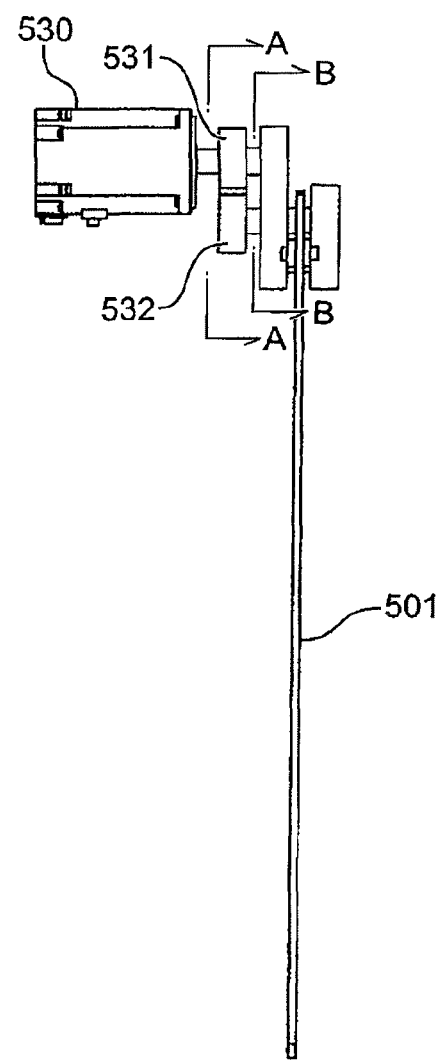
FIG. 10C is a side view of the anode mask of the anode unit according to the third embodiment.
Figure 10D:
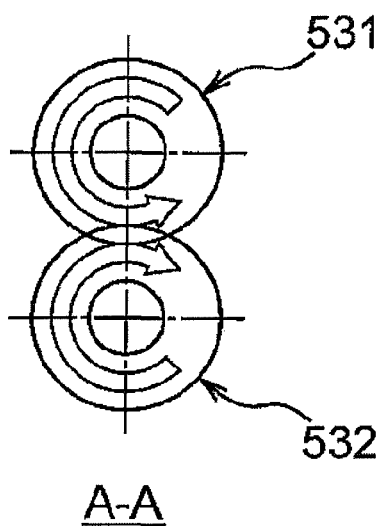
FIG. 10D is an arrow view along line A-A of FIG. 10C.
Figure 10E:
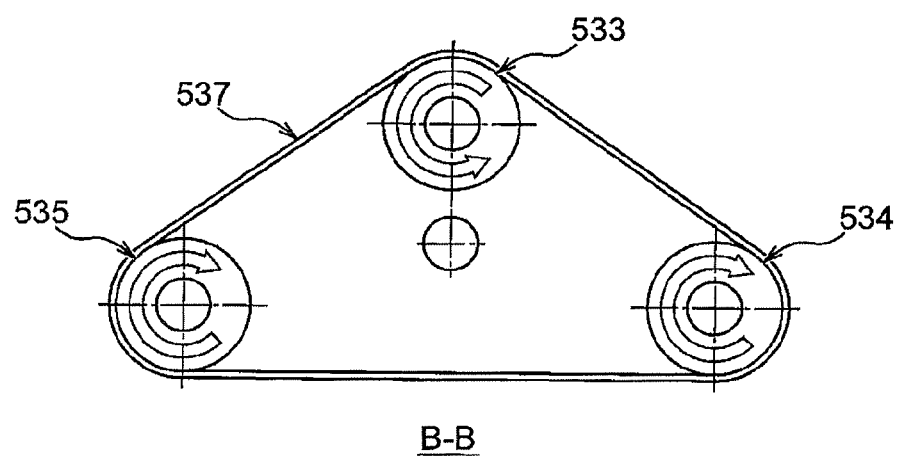
FIG. 10E is an arrow view along line B-B of FIG. 10C.

FIG. 10A is a perspective view of an anode mask of an anode unit according to third embodiment when the anode mask is viewed from a front side. FIG. 10B is a perspective view of the anode mask of the anode unit according to the third embodiment when the anode mask is viewed from a rear side. FIG. 10C is a side view of the anode mask of the anode unit according to the third embodiment. FIG. 10D is an arrow view along line A-A in FIG. 10C. FIG. 10E is an arrow view along line B-B of FIG. 10C.

An anode mask 500 is arranged in front of a side on which the anode holder 200 described above has an opening portion 204. The anode mask 500 includes a base 501, a shielding member 510, and a shielding member 520. The base 501, the shielding member 510, and the shielding member 520 constitute first to third shielding members, respectively.

Figure 11A:
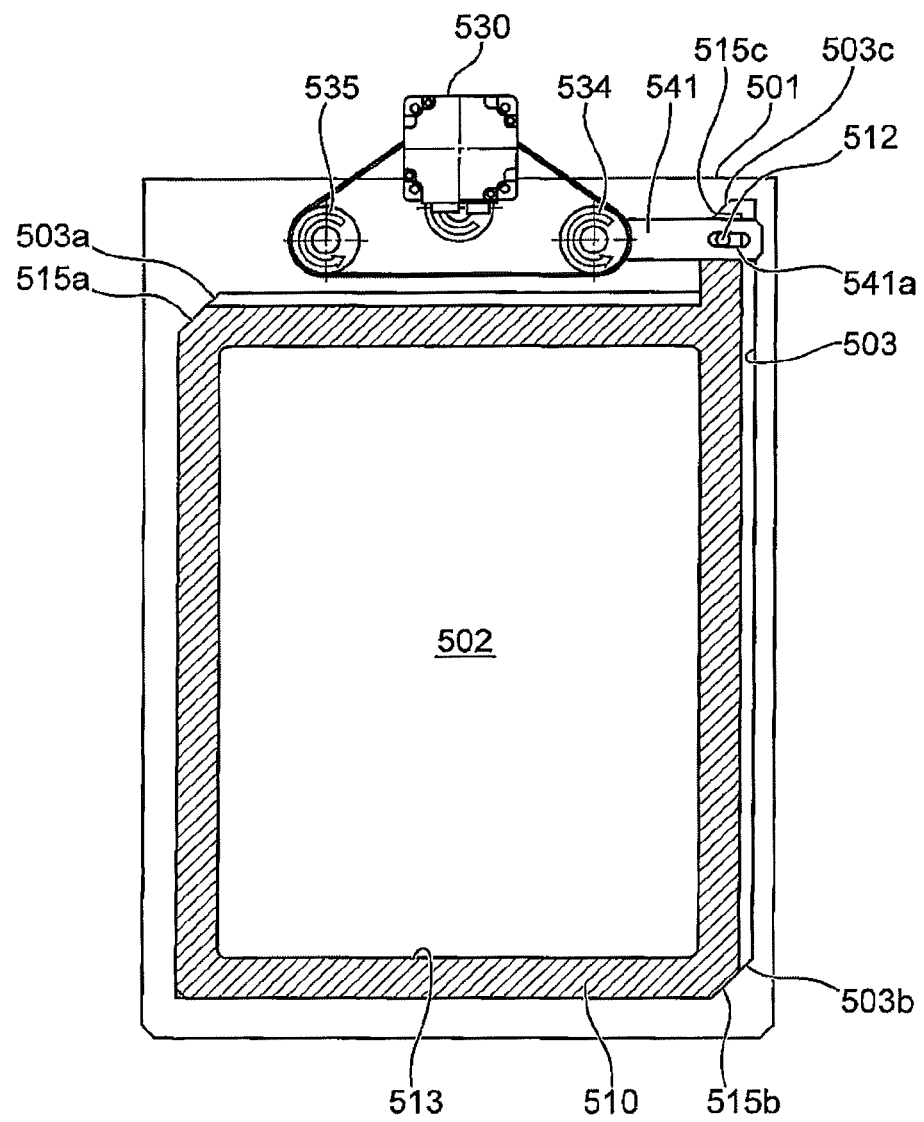
FIG. 11A is a front view of the anode mask under a first state.
Figure 12A:
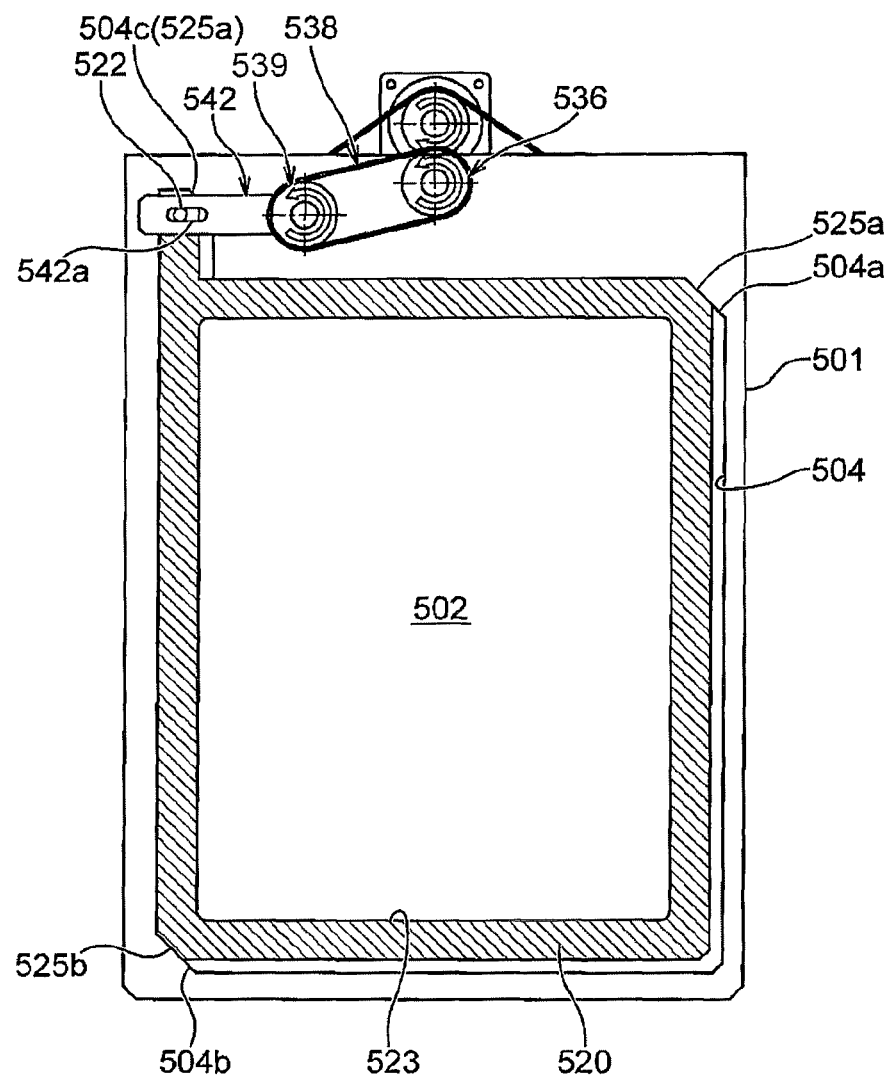
FIG. 12A is a rear view of the anode mask under the first state.

The base 501 has an opening portion 502. A guide portion 503 including a concave portion for guiding the movement of the shielding member 510 is formed on the front surface of the base 501. A guide portion 504 including a concave portion for guiding the movement of the shielding member 520 is formed on the rear surface of the base 501. One or both of the guide portions 503 and 504 may be a configuration other than the concave portion. For example, a configuration in which a guide member as a different member is fitted, or a configuration in which a concave portion and a guide member as a different member are combined with each other may be adopted. The guide portion 503 has inclined guide portions 503a to 503c for guiding the movement of the shielding member 510 in an oblique direction (a direction between the right and left direction and the up and down direction) (FIG. 11A). The shielding member 510 also has inclined side portions 515a to 515c at positions corresponding to the inclined guide portions 503a to 503c. The guide portion 504 has inclined guide portions 504a to 504c for guiding the movement in the inclined direction (the direction between the right and left direction and the up and down direction) of the shielding member 520 (FIG. 12A).

The shielding member 520 also has inclined side portions 525a to 525c at positions corresponding to the inclined guide portions 504a to 504c.

The shielding member 510 is a frame-shaped member and has an opening portion 513. The shielding member 510 includes a lower mask 510a, a left mask 510b, a right mask 510c, and an upper mask 510d. The opening portion 513 of the shielding member 510 is configured so as to have the same shape and size as the opening portion 502 of the base 501 or a smaller size than that of the opening portion 502 of the base 501 so that the opening portion 513 of the shielding member 510 defines the opening region of the opening portion 502 of the base 501 under the first state (FIGS. 10A and 10B, FIGS. 11A and 11B). The shielding member 510 further has an extension portion 511 extending upward beyond the upper mask 510d, and the extension portion 511 is provided with a pin 512. The pin 512 is engaged with an elongated hole 541a of a link 541.

The shielding member 520 is a frame-shaped member and has an opening portion 523. The shielding member 520 includes a lower mask 520a, a left mask 520b, a right mask 520c, and an upper mask 520d. The opening portion 523 of the shielding member 520 is configured so as to have the same shape and size as the opening portion 502 of the base 501 or have a smaller size than that of the opening portion 502 of the base 501 so that the opening portion 523 of the shielding member 520 defines the opening region of the opening portion 502 of the base 501 under the first state (FIGS. 10A and 10B, FIGS. 11A and 11B). The shielding member 520 further has an extension portion 521 extending upward beyond the upper mask 520d, and the extension portion 521 is provided with a pin 522. The pin 522 is engaged with an elongated hole 542a of a link 542.

In the present embodiment, the opening portion 523 of the shielding member 520 has the same shape and size as the opening portion 513 of the shielding member 510. Under the first state, the opening region of the opening portion 502 of the base 501 is defined by the opening portion 523 of the shielding member 520 and the opening portion 513 of the shielding member 510, and is maximum. Under the first state, the opening portions 513 and 523 of the shielding members 510 and 520 may be formed to be larger than the opening portion 502 of the base 501, so that the opening region of the opening portion 502 of the base 501 is defined by the opening region itself of the opening portion 502. In addition, under the first state, at least a part of the upper side, the lower side, the left side, and the right side of the opening region of the opening portion 502 of the base 501 may be regulated by at least one of the opening portion 523 of the shielding member 520 and the opening portion 513 of the shielding member 510.

The anode mask 500 includes a motor 530 as a drive source. In the present embodiment, the motor 530 is provided on the front surface side of the base 501. The rotation shaft of the motor 530 is connected to a gear 531 and a pulley 533. The pulley 533 is connected to pulleys 534 and 535 by a belt 537 as shown in FIGS. 10A and 10E. As shown in FIG. 10A, the pulley 534 is connected to one end side of the link 541, and is configured to transmit a rotational motion to the link 541. As shown in FIGS. 10A and 10D, the gear 531 meshes with a gear 532, and the rotation in the opposite direction to the rotation of the gear 531 is transmitted to the gear 532. The shaft of the gear 532 penetrates from the front surface side to the back surface side of the base 501, and a pulley 536 is connected to this shaft as shown in FIG. 10B. The pulley 536 is connected to a pulley 539 via a belt 538. As shown in FIG. 10B, the pulley 539 is connected to one end side of the link 542, and is configured to transmit a rotational motion to the link 542. In this configuration, the rotation in the same direction as the rotation of the motor 530 is transmitted to the link 541 via the pulleys 533 and 534, and the rotation in the opposite direction to the rotation of the motor 530 is transmitted to the link 542 via the gear 532, and the pulleys 536 and 537. As a result, the shielding member 510 and the shielding member 520 are moved diagonally in opposite directions by the rotation of the motor 530.

Figure 11B:
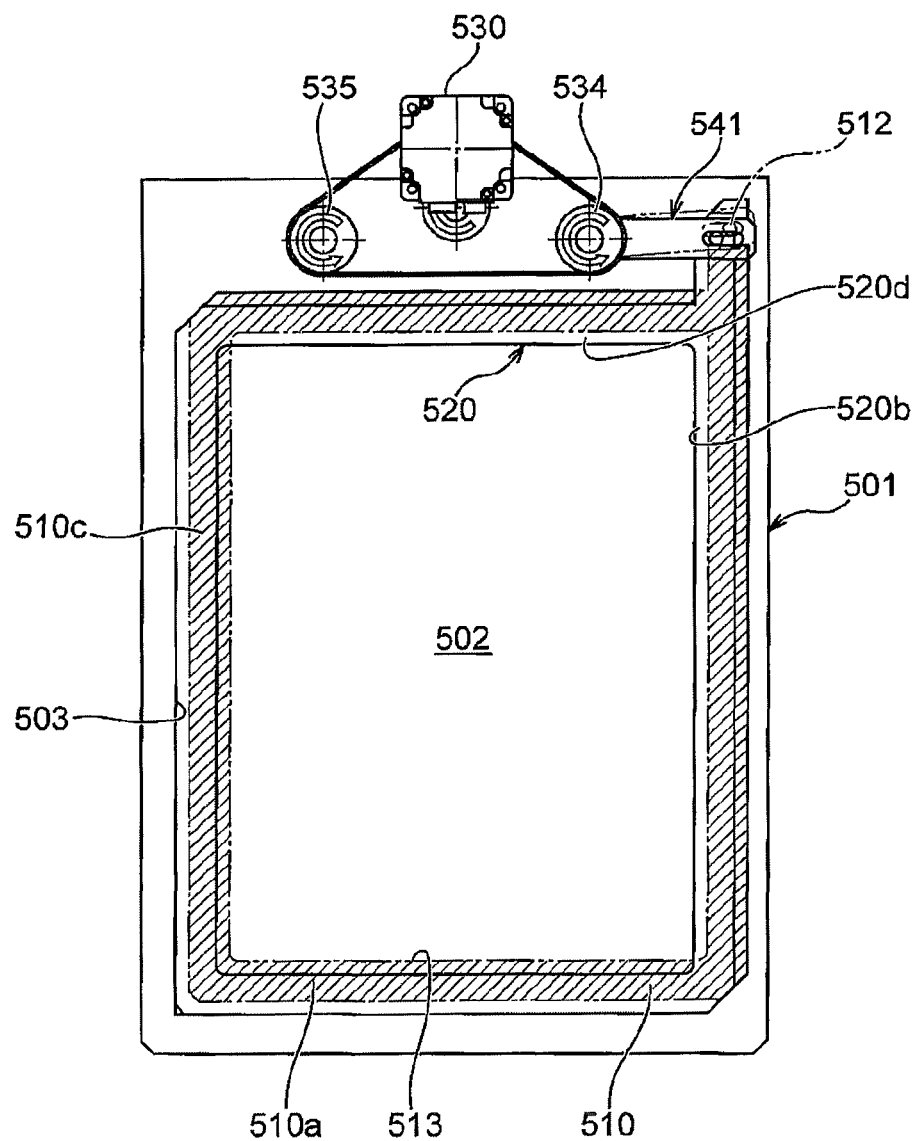
FIG. 11B is a front view of the anode mask under a second state.
Figure 12B:
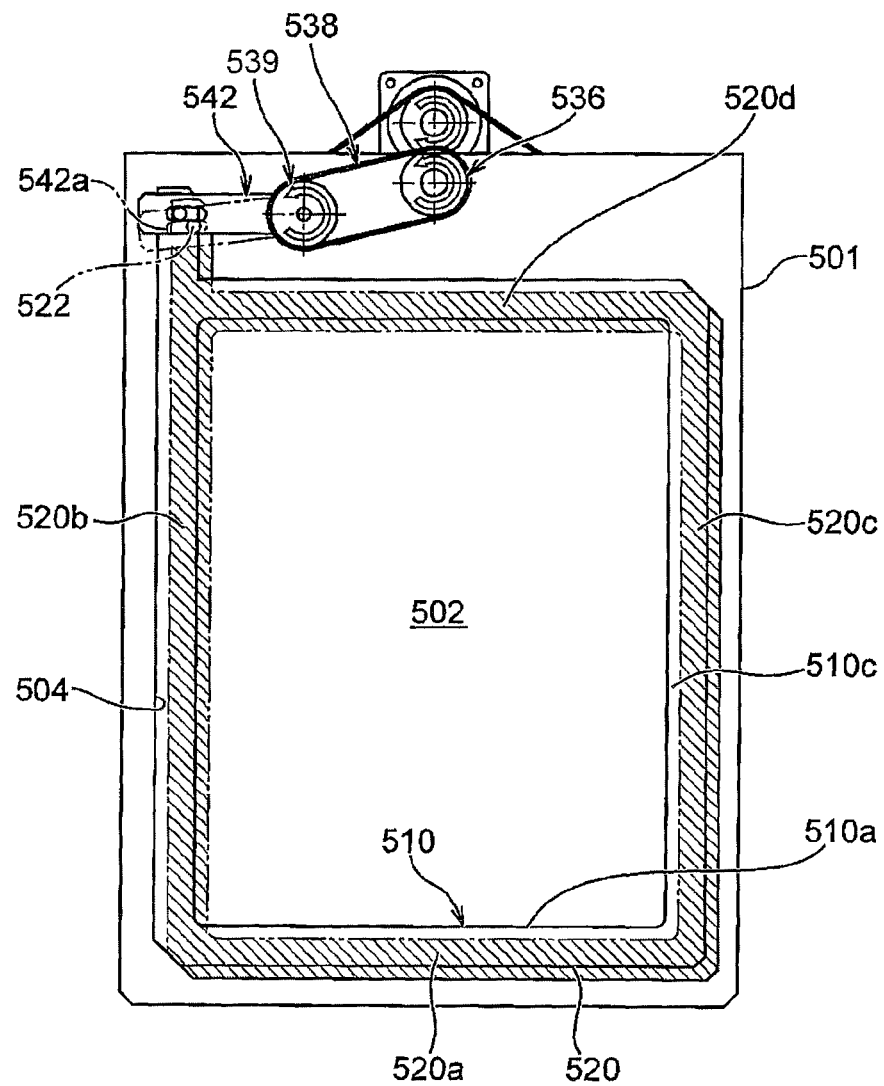
FIG. 12B is a rear view of the anode mask under the second state.

FIG. 11A is a front view of the anode mask under the first state. FIG. 11B is a front view of the anode mask under the second state. FIG. 12A is a rear view of the anode mask under the first state. FIG. 12B is a rear view of the anode mask under the second state.

When the pulley 534 is rotated counterclockwise by rotation of the motor 530 in FIG. 11A, as shown in FIG. 11B, the link 541 rotates counterclockwise, and the shielding member 510 is moved obliquely upward via the pin 512 engaged with the elongated hole 541a. At this time, the shielding member 510 is moved obliquely upward along the inclined guide portion located on a diagonal line of the guide portion 503 while the pin 512 of the shielding member 510 moves within the elongated hole 541a of the link 541. As a result, the lower mask 510a and the right mask 510c of the shielding member 510 reduce the opening regions at the lower-side end portion and the right-side end portion of the opening portion 502.

When the pulley 539 is rotated counterclockwise by rotation of the motor 530 in FIG. 12A, as shown in FIG. 12B, the link 542 rotates counterclockwise, and the shielding member 520 is moved obliquely downward via the pin 522 engaged with the elongated hole 542a. At this time, the shielding member 520 is moved obliquely downward along the inclined guide portion on a diagonal line of the guide portion 504 while the pin 522 of the shielding member 520 moves within the elongated hole 542a of the link 542. As a result, the upper mask 520d and the left mask 520b of the shielding member 520 reduce the opening regions at the upper-side end portion and the left-side end portion of the opening portion 502.

The movement from FIGS. 11B and 12B (second state) to FIGS. 11A and 12A (first state) is performed in the reverse operation by reversely rotating the motor. The rotation angles of the links 541 and 542 are adjusted by the rotation of the motor, thereby adjusting the opening region of the opening portion 502 with the shielding members 510 and 520.

As shown in FIGS. 11B and 12B, the shielding member 510 moves obliquely upward to the left, so that the lower mask 510a and the right mask 510c of the shielding member 510 reduce the opening regions at the lower-side end portion and the right-side end portion of the opening portion 502, and the shielding member 520 moves obliquely downward to the right, so that the upper mask 520d and the left mask 520b of the shielding member 520 reduce the opening regions at the upper-side end portion and the left-side end portion of the opening portion 502. As a result, the opening region of the opening portion 502 is synchronously reduced at the upper, lower, right and left end portions. In other words, the shielding members 510 and 520 move in opposite directions along the diagonal directions of the shielding members 510 and 520, whereby the opening region of the opening portion 502 is adjusted according to the movement amounts of the shielding members 510 and 520.

In the above description, the case where the shielding members 510 and 520 are moved along the diagonal lines has been described. However, the shielding members 510 and 520 may be configured so as to move in oblique directions other than the diagonal line directions. Furthermore, the shielding members 510 and 520 may be configured so as to move along different straight lines.

The configuration of the anode mask according to the third embodiment can also be applied to the regulation plate in the same manner as described with reference to the first embodiment. In addition, the opening regions of the anode mask and the regulation plate according to the third embodiment can also be adjusted by the controller in the same manner as described with reference to the first embodiment.

Fourth Embodiment

Figure 13:
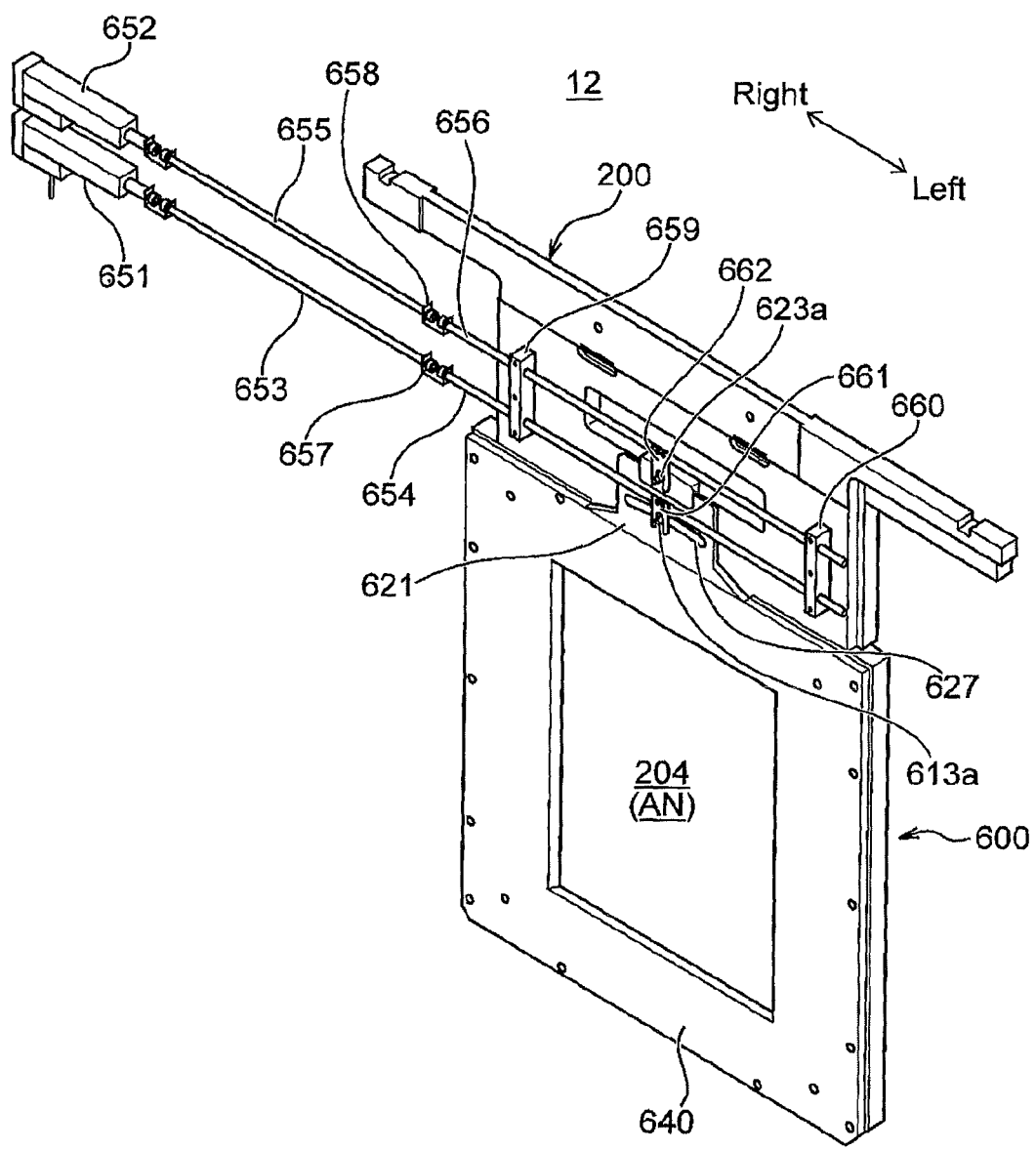
FIG. 13 is a perspective view of an anode unit according to a fourth embodiment.
Figure 14:
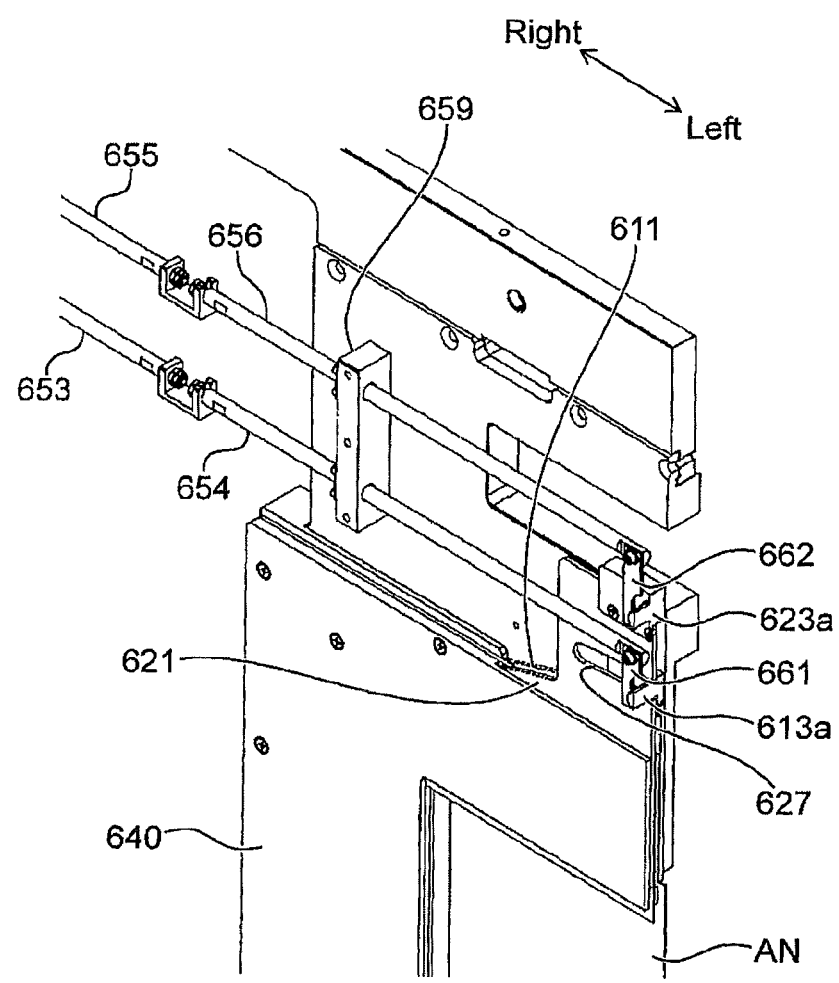
FIG. 14 is a partially notched perspective view of the anode unit according to the fourth embodiment.
Figure 15A:
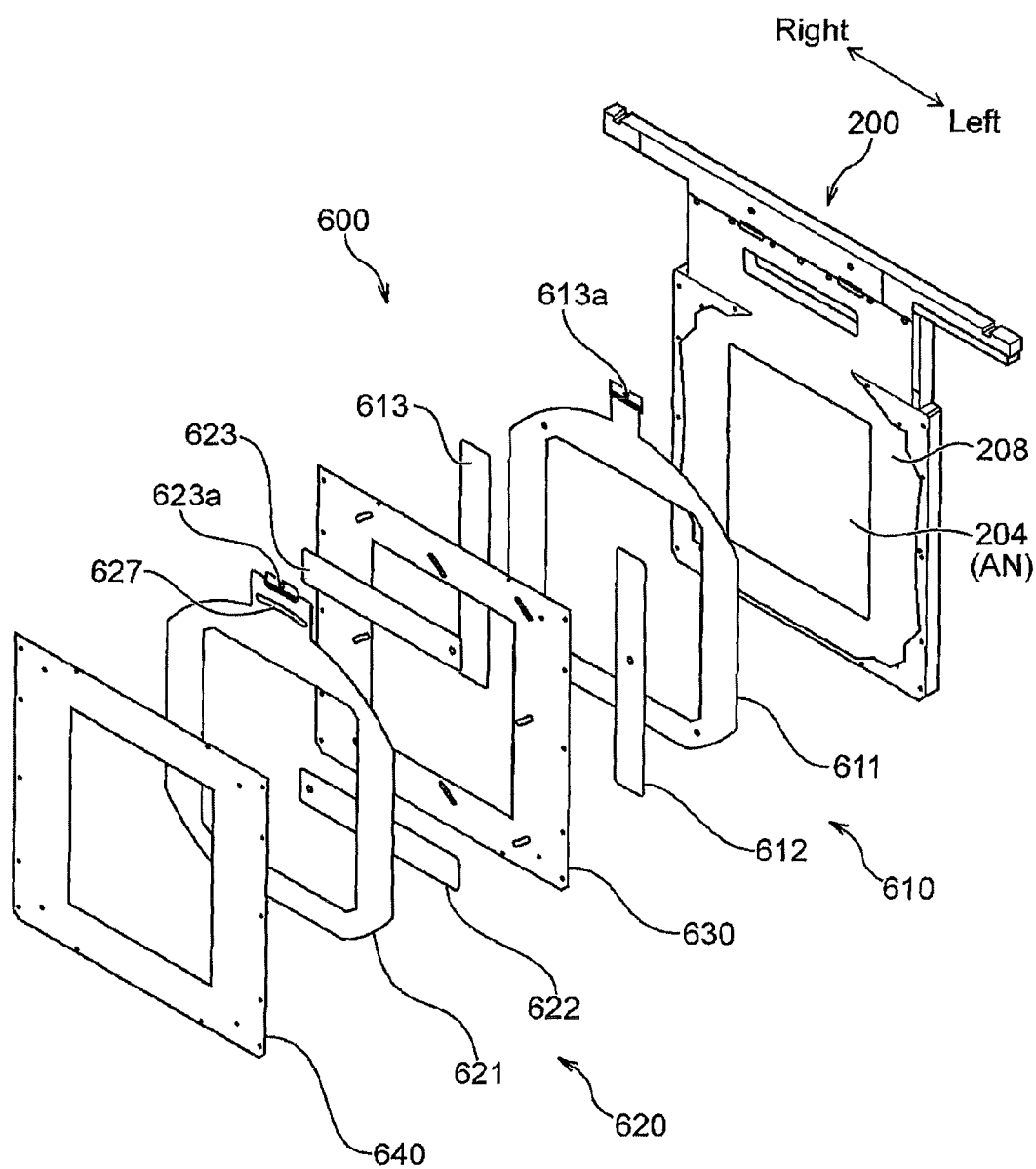
FIG. 15A is an exploded perspective view of the anode unit according to the fourth embodiment when viewed from a front side of the anode unit.
Figure 15B:
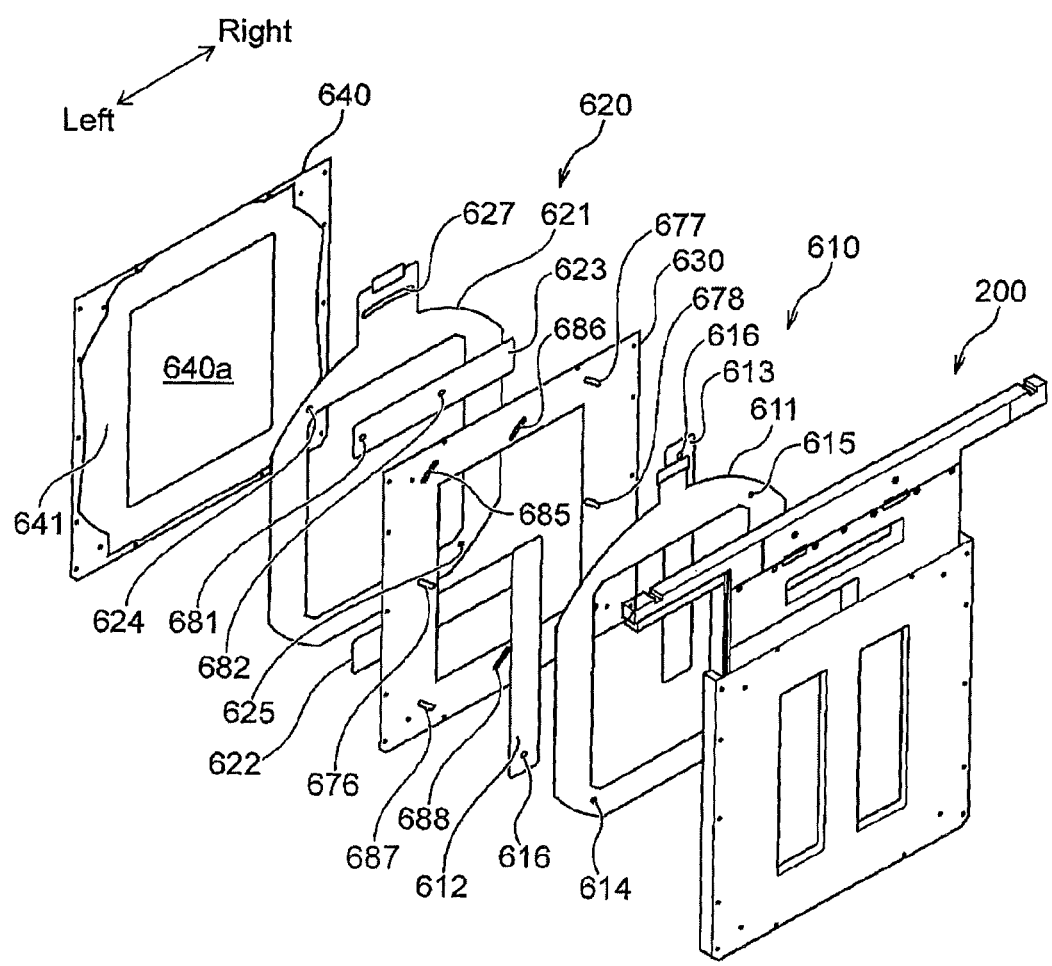
FIG. 15B is an exploded perspective view of the anode unit according to the fourth embodiment when viewed from a rear side of the anode unit.
Figure 16:
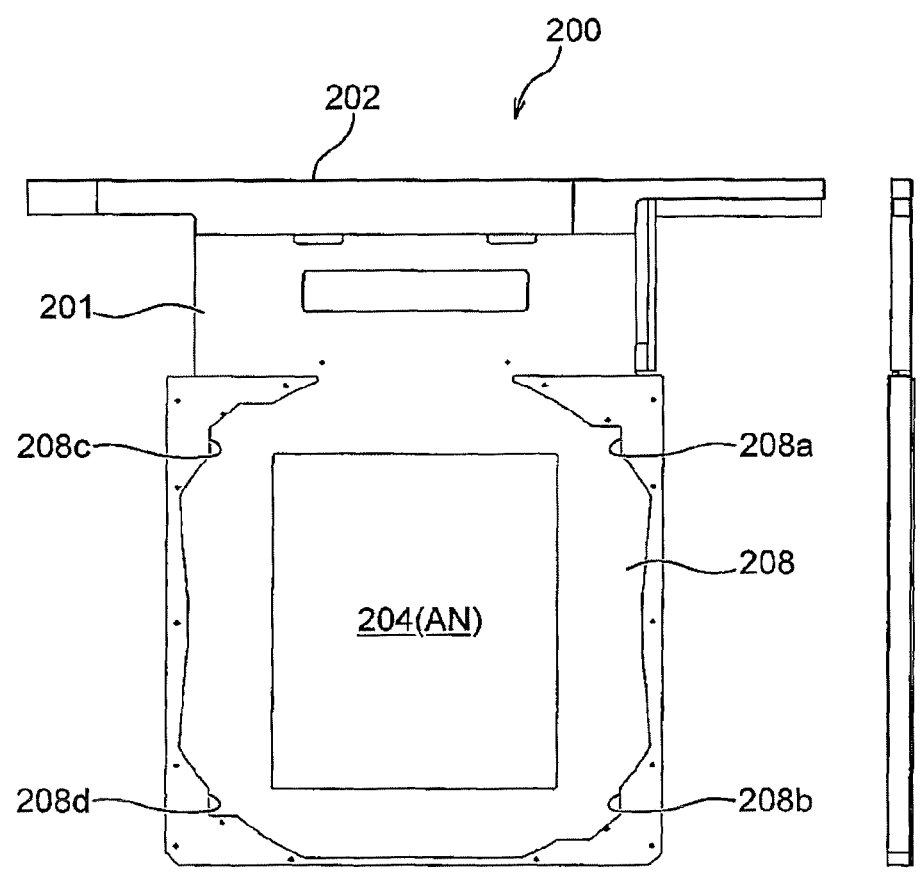
FIG. 16 is a front view of an anode holder.
Figure 17:
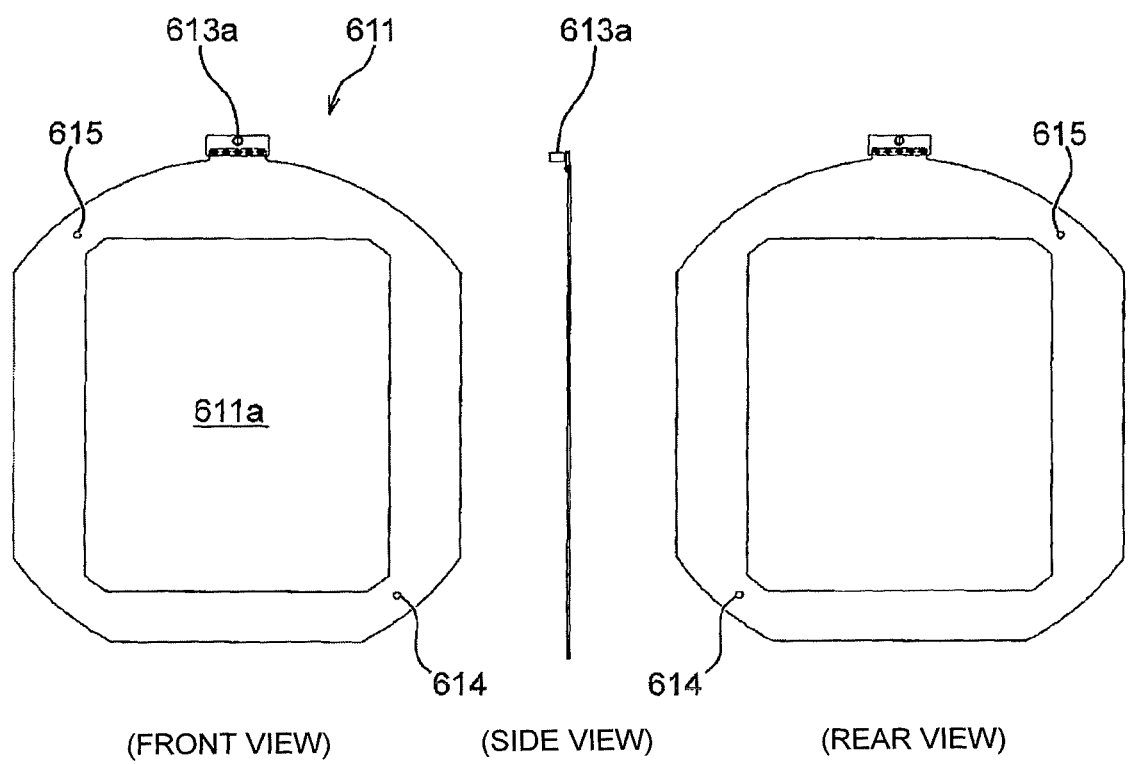
FIG. 17 is front, side and rear views of a right and left mask changing lever.
Figure 18:
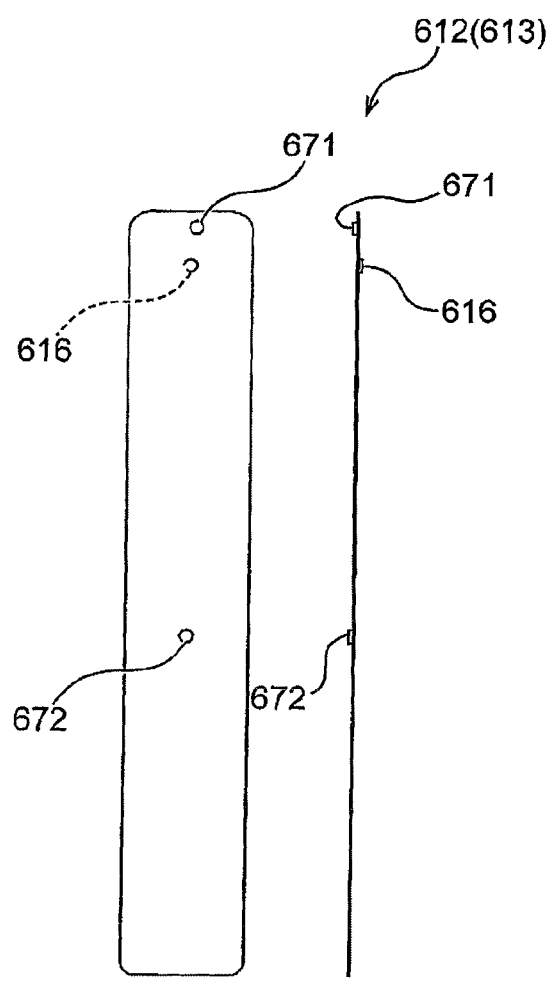
FIG. 18 is front and side views of a right and left mask blade.
Figure 19:
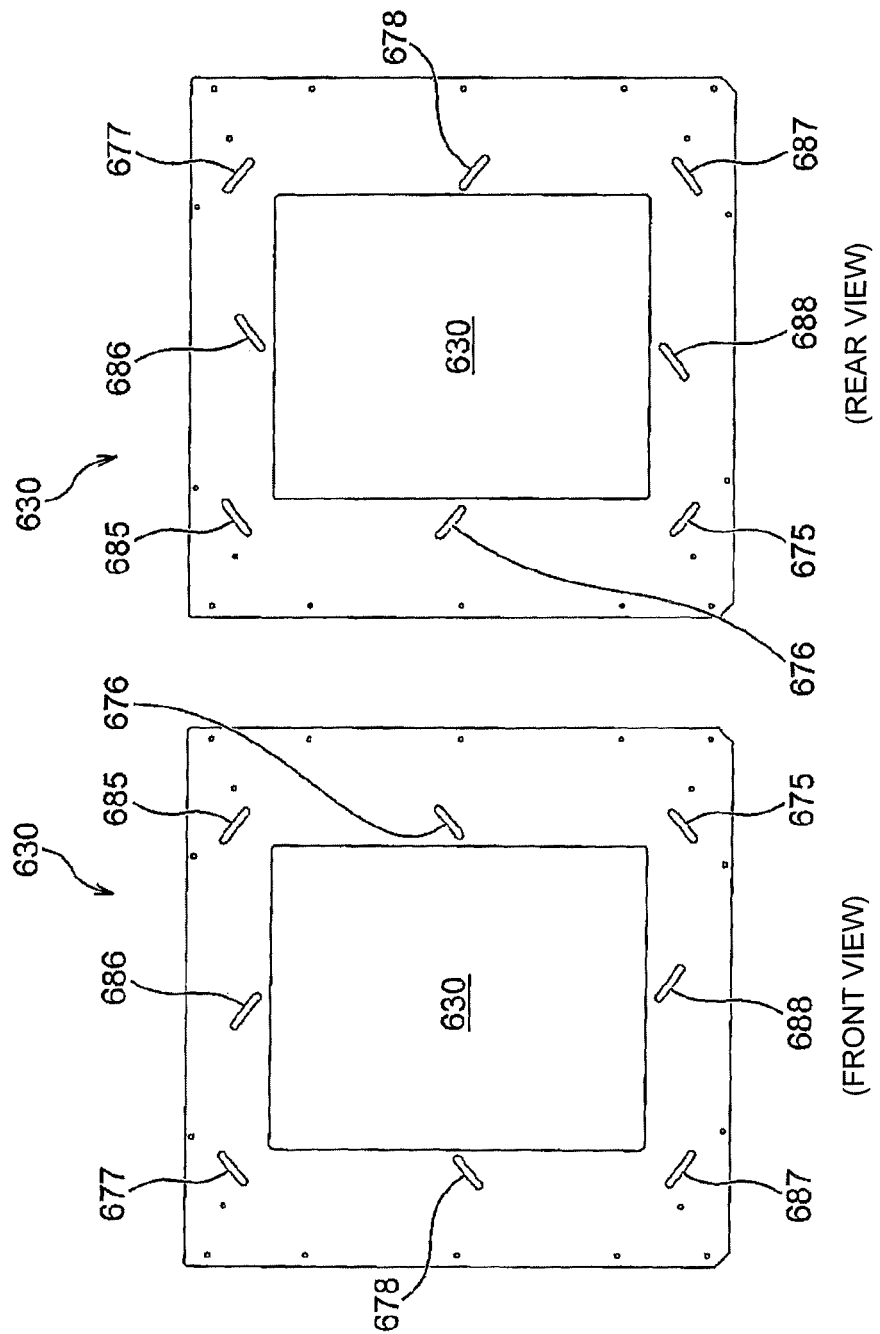
FIG. 19 is front and rear views of an intermediate guide member.
Figure 20:
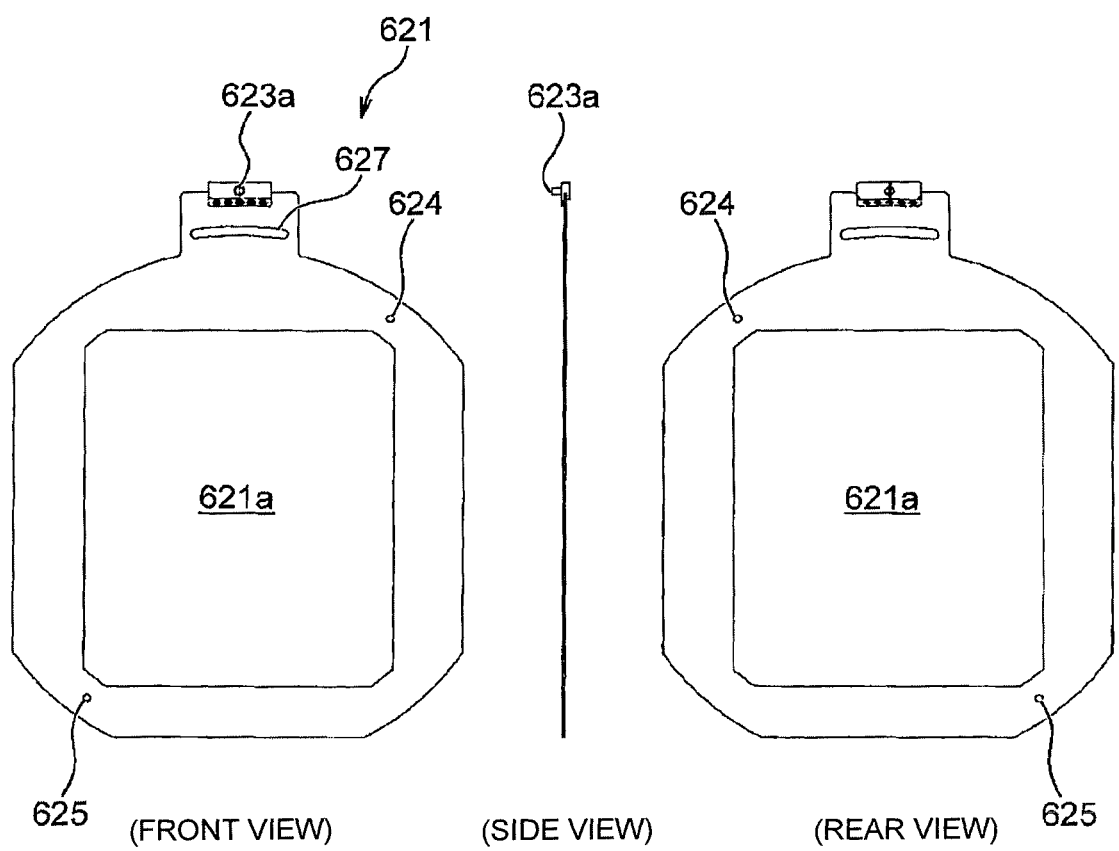
FIG. 20 is front, side and rear views of an upper and lower mask changing lever.
Figure 21:
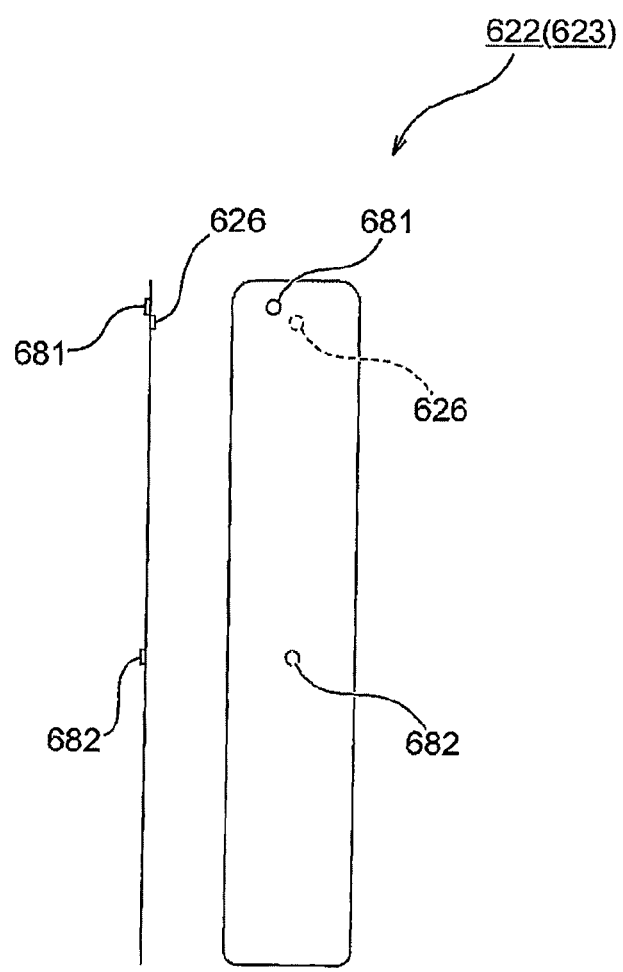
FIG. 21 is front and side views of an upper and lower mask blade.
Figure 22:
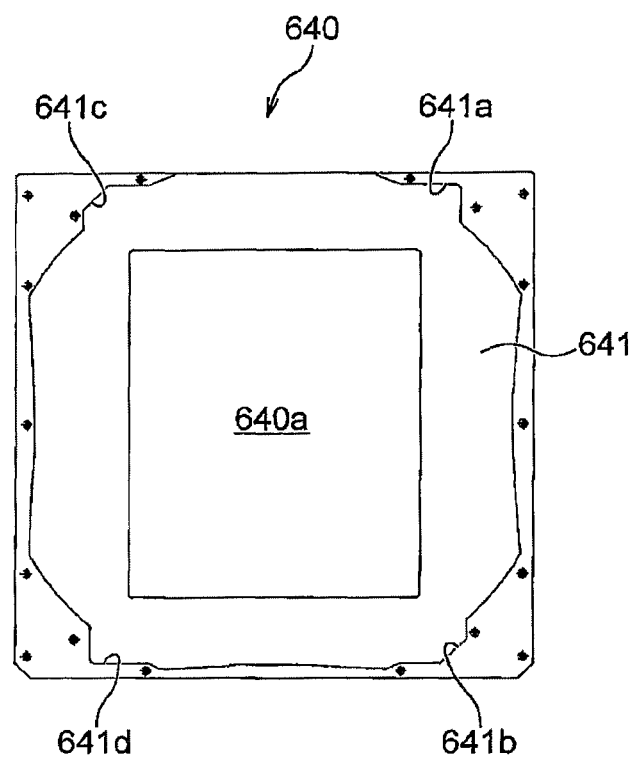
FIG. 22 is a rear view of a front side guide member.

FIG. 13 is a perspective view of an anode unit according to a fourth embodiment. FIG. 14 is a partially notched perspective view of the anode unit according to the fourth embodiment. FIG. 15A is an exploded perspective view of the anode unit according to the fourth embodiment when the anode unit is viewed from the front side. FIG. 15B is an exploded perspective view showing the anode unit according to the fourth embodiment when the anode unit is viewed from the rear side. FIG. 16 is a front view of an anode holder. FIG. 17 is a front view, a side view, and a rear view of a right and left mask changing lever. FIG. 18 is a front view and a side view of a right and left mask blade. FIG. 19 is a front view and a rear view of an intermediate guide member. FIG. 20 is a front view, a side view, and a rear view of an upper and lower mask changing lever. FIG. 21 is a front view and a side view of an upper and lower mask blade. FIG. 22 is a rear view of a front side guide member.

The anode unit 12 according to the present embodiment includes an anode holder 200 and an anode mask 600. The anode holder 200 has an opening portion 204, and the anode electrode AN is exposed from the opening portion 204. As in the case of the first embodiment, when the anode holder and the anode mask are separately provided, the anode holder 200 can be used as the base plate of the anode mask 300.

As shown in FIGS. 15B and 16, the anode holder 200 has a guide portion 208 for guiding movement of a right and left mask changing lever 611 of a right and left mask 610 described later. The guide portion 208 is formed as a counter bore provided to the anode holder main body 201. The depth of this counter bore is slightly larger than the thickness of the overlap of the right and left mask changing lever 611 and the right and left blades 612 and 613. Blade release portions 208a to 208d for releasing the right and left blades 612 and 613 particularly when the right and left blades 612 and 613 move are provided at four corners of the guide portion 208.

The anode mask 600 includes the right and left mask 610, an upper and lower mask 620, an intermediate guide member 630, and a front side guide member 640. The right and left mask 610 is arranged between the anode holder 200 and the intermediate guide member 630, and the upper and lower mask 620 is arranged between the intermediate guide member 630 and the front side guide member 640. The intermediate guide member 630 is sandwiched between the anode holder 200 and the front side guide member 640, and an outer peripheral portion thereof is screwed. That is, it can be said that the intermediate guide member 630 is fixed to the anode holder 200 or the anode mask 600. The intermediate guide member 630 does not move together with the right and left mask 610 and the upper and lower mask 620, and functions as a base plate of the anode mask 600. The right and left mask 610 is accommodated in the guide portion 208 formed on the front surface of the anode holder 200. The upper and lower mask 620 is accommodated in a guide portion 641 of the front side guide member 640 as described later.

As shown in FIG. 22, the front side guide member 640 has an opening portion 640a larger than the opening portion 204. The front side guide member 640 has the guide portion 641 for guiding the movement of an upper and lower mask changing lever 621 of the upper and lower mask 620 described later (FIGS. 15B and 22). The guide portion 641 is formed as a counter bore provided on the back surface of the front side guide member 640, and the depth of the counter bore is slightly larger than the thickness of the overlap of the upper and lower mask changing lever 621 and the upper and lower blades 622 and 623. Blade release portions 641a to 641d for releasing the upper and lower blades 622 and 623 particularly when the upper and lower blades 622 and 623 move are provided at the four corners of the guide portion 641.

As shown in FIG. 15B, the right and left mask 610 includes the right and left mask changing lever 611 and the right and left blades (masks) 612 and 613. As shown in FIG. 17, the right and left mask changing lever 611 is shaped from a frame-shaped member having a substantially circular contour such that straight portions are provided on the outer peripheral portions of the lower portion and the right and left portions. The right and left mask changing lever 611 has a substantially rectangular opening portion 611a. The opening portion 611a is larger than the opening portion 204, and is arranged so as to surround the outside of the opening portion 204. Engaging holes 614 and 615 are provided at two positions substantially on a diagonal line of the opening portion 611a of the right and left mask changing lever 611. Engaging pins 616 of the right and left blades 612 and 613 described later are engaged with these engaging holes 614 and 615, whereby the right and left blades 612 and 613 are engaged with the right and left mask changing lever 611.

An engaging pin 613a is provided at the upper end portion of the right and left mask changing lever 611 (FIG. 15A). As shown in FIGS. 13 and 14, the engaging pin 613a is engaged with an engaging hook 661 fixed to a rod 654 while penetrating through a guide groove 627 of the upper and lower mask changing lever 621. The rod 654 is guided so as to be capable of reciprocating by guide members 659 and 660 fixed to the anode holder 200. The rod 654 is connected to the rod 653 via a joint 657, and the rod 653 is connected to an actuator 651. The actuator 651 is a device capable of reciprocating the rods 653 and 654 in the right and left direction. The actuator 651 is fixed to the plating bath 10, and includes, for example, a motor and a rotation/rectilinear motion converting mechanism (a ball screw mechanism, a ball ramp mechanism, or the like) for converting the rotation of the motor to a rectilinear motion. The actuator 651 may have another configuration such as a solenoid, an air cylinder, or the like. When the actuator 651 moves the engaging pin 613a leftward via the rods 653 and 654 and the engaging hook 661, the right and left mask changing lever 611 rotates clockwise as viewed from the front side. When the actuator 651 moves the engaging pin 613a rightward via the rods 653 and 654 and the engaging hook 661, the right and left mask changing lever 611 rotates counterclockwise as viewed from the front side.

The right and left blades 612 and 613 have the same configuration, and as shown in FIG. 18, each of the right and left blades 612 and 613 has an engaging pin 616 on a first surface thereof and guide pins 671 and 672 on a second surface thereof. The engaging pin 616 of the right and left blade (left blade) 612 is engaged with the engaging hole 614 of the right and left mask changing lever 611, whereby the right and left blade 612 is engaged with the right and left mask changing lever 611 (FIG. 15B). The guide pins 671 and 672 of the right and left blade 612 are engaged with the guide grooves 675 and 676 of the intermediate guide member 630, respectively (FIG. 15B). As a result, when the right and left mask changing lever 611 is rotated, the right and left blade 612 is guided so as to move obliquely along the guide grooves 675 and 676 while maintaining a parallel posture to the right side of the opening portion 204. As a result, the right and left blade 612 moves in the right and left direction while maintaining the parallel posture to the left side of the opening portion 204 so as to change the opening region of the left-side end portion of the opening portion 204.

Likewise, the engaging pin 616 of the right and left blade (right blade) 613 is engaged with the engaging hole 615 of the right and left mask changing lever 611, whereby the right and left blade 613 is engaged with the right and left mask changing lever 611 (FIG. 15B). The guide pins 671 and 672 of the right and left blade 613 are engaged with the guide grooves 677 and 678 of the intermediate guide member 630, respectively (FIG. 15B). As a result, the right and left blade 613 is guided so as to move obliquely along the guide grooves 677 and 678 while maintaining a parallel posture to the right side of the opening portion 204. As a result, the right and left blade 613 moves substantially in the right and left direction while maintaining the parallel posture to the right side of the opening portion 204 so as to change the opening region of the right side end portion of the opening portion 204.

The upper and lower mask 620 has substantially the same configuration as the right and left mask 610. The upper and lower mask 620 includes an upper and lower mask changing lever 621, and upper and lower blades (masks) 622 and 623. As shown in FIG. 20, the upper and lower mask changing lever 621 is shaped from a frame-shaped member having a substantially circular contour such that straight portions are provided on the outer peripheral portions of the lower portion and the right and left portions. The upper and lower mask changing lever 621 has a substantially rectangular opening portion 621a. The opening portion 621a is larger than the opening portion 204, and is arranged so as to surround the outside of the opening portion 204. Engaging holes 624 and 625 are provided at two positions substantially on a diagonal line of the opening portion 621a of the upper and lower mask changing lever 621. Engaging pins 626 of the upper and lower blades 622 and 623 described later are engaged with these engaging holes 624 and 625, whereby the upper and lower blades 622 and 623 are engaged with the upper and lower mask changing lever 621.

An engaging pin 623a is provided at the upper end portion of the upper and lower mask changing lever 621 (FIGS. 15A and 20). As shown in FIGS. 13 and 14, the engaging pin 623a is engaged with an engaging hook 662 fixed to a rod 656. The rod 656 is guided so as to be capable of reciprocating by guide members 659 and 660 fixed to the anode holder 200. The rod 656 is connected to a rod 655 via a joint 658, and the rod 655 is connected to an actuator 652. The actuator 652 is a device capable of reciprocating the rods 655 and 656 in the right and left direction. The actuator 652 includes, for example, a motor and a rotation/rectilinear motion converting mechanism (a ball screw mechanism, a ball ramp mechanism or the like) for converting the rotation of the motor to a rectilinear motion. The actuator 652 may have another configuration such as a solenoid, an air cylinder, or the like. When the actuator 652 moves the engaging pin 623a leftward via the rods 655 and 656 and the engaging hook 662, the upper and lower mask changing lever 621 rotates clockwise as viewed from the front side. When the actuator 652 moves the engaging pin 623 rightward via the rods 655 and 656 and the engaging hook 662, the upper and lower mask changing lever 621 rotates counterclockwise as viewed from the front side.

The upper and lower blades 622 and 623 have the same configuration, and include engaging pins 626 on first surfaces thereof and guide pins 681 and 682 on second surfaces thereof as shown in FIG. 21. The engaging pin 626 of the upper and lower blade (lower blade) 622 is engaged with the engaging hole 625 of the upper and lower mask changing lever 621, whereby the upper and lower blade 622 is engaged with the upper and lower mask changing lever 621 (FIGS. 15B and 20). The guide pins 681 and 682 of the upper and lower blade 622 are engaged with the guide grooves 687 and 688 of the intermediate guide member 630 (FIGS. 15B and 19). As a result, when the upper and lower mask changing lever 621 is rotated, the upper and lower blade 622 is guided so as to move in an oblique direction along the guide grooves 687 and 688 while maintaining a parallel posture to the lower side of the opening portion 204. As a result, the upper and lower blade 622 moves in the up and down direction while maintaining the parallel posture to the lower side of the opening portion 204 so as to change the opening region of the lower-side end portion of the opening portion 204.

Likewise, the engaging pin 626 of the upper and lower blade (upper blade) 623 is engaged with the engaging hole 624 of the upper and lower mask changing lever 621, whereby the upper and lower blade 623 is engaged with the upper and lower mask changing lever 621 (FIGS. 15B and 20). The guide pins 681 and 682 of the upper and lower blade 623 are engaged with the guide grooves 685 and 686 of the intermediate guide member 630 (FIGS. 15B and 19). As a result, the upper and lower blade 623 is guided so as to move obliquely along the guide grooves 685 and 686 while maintaining a parallel posture to the upper side of the opening portion 204. As a result, the upper and lower blade 623 moves in the up and down direction while maintaining the parallel posture to the upper side of the opening portion 204 so as to change the opening region of the upper end portion of the opening portion 204.

Figure 23A:
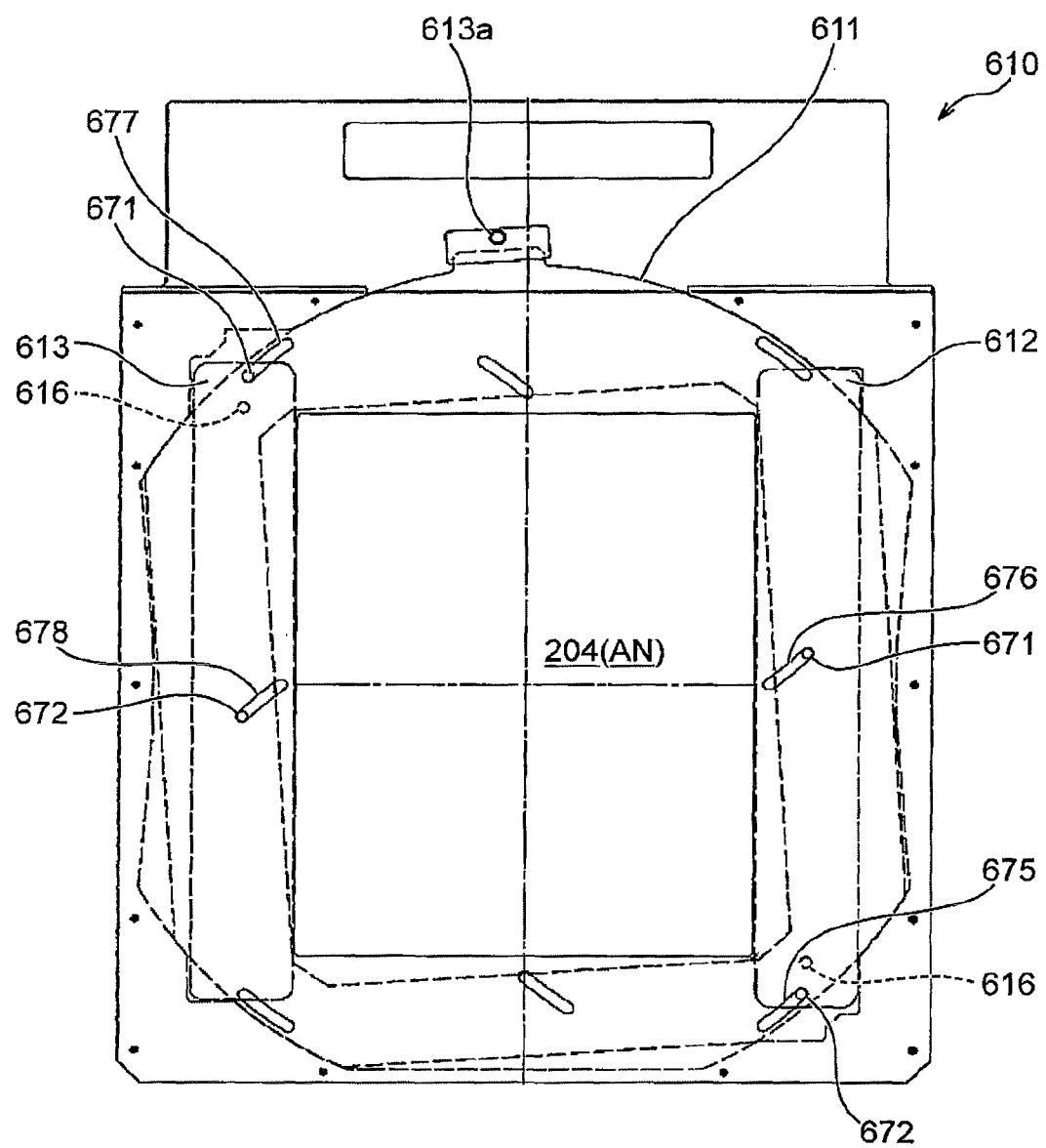
FIG. 23A is a front view of right and left masks under a first state.
Figure 23B:
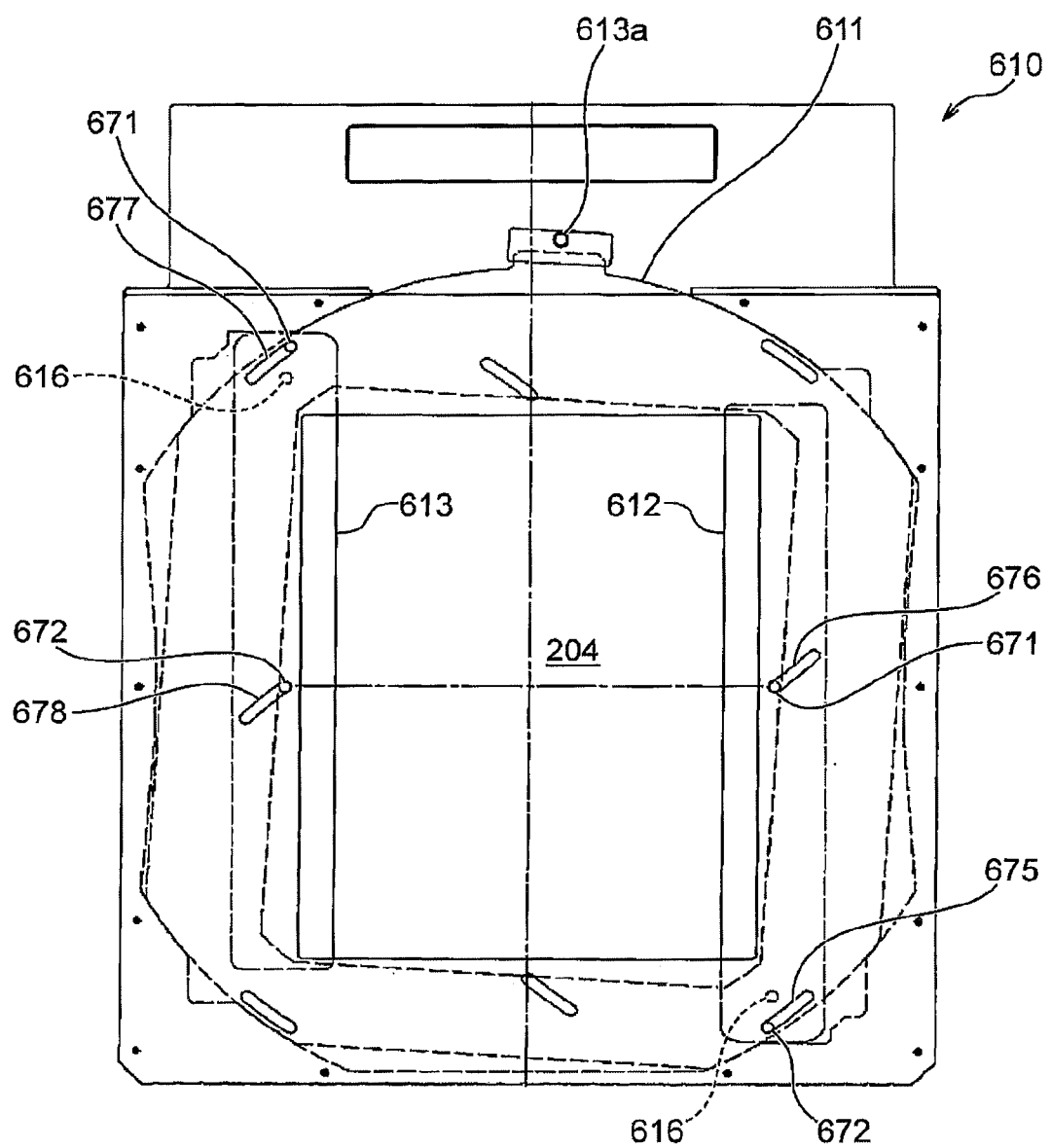
FIG. 23B is a front view of the right and left masks under a second state.

FIG. 23A is a front view of the right and left mask under the first state. FIG. 23B is a front view of the right and left mask under the second state. Under the first state (FIG. 23A), the right and left blades 612 and 613 are in a maximally expanded or separated state, and the inner sides of the right and left blades 612 and 613 coincide with the left side and the right side of the opening portion 204 of the anode holder 200, respectively. The inner sides of the right and left blades 612 and 613 may be located outside the left side and right side of the opening portion 204 of the anode holder 200. Furthermore, the right and left blades 612 and 613 may be configured so that parts thereof overlap the opening portion 204 under the first state. Under the second state (FIG. 23B), the right and left blades 612 and 613 are in a minimally contracted or most closely approached state, and the inner sides of the right and left blades 612 and 613 are displaced inwards from the left side and right side of the opening portion 204 of the anode holder 200 by the maximum amount.

When the right and left blade changing lever 611 is rotated clockwise as viewed from the front side under the first state (FIG. 23A) by power from the actuator 651, the pins 616 of the right and left blades 612 and 613 also rotate clockwise. However, the guide pins 671 and 672 of the right and left blades 612 and 613 are guided by the guide grooves 675 and 676 (677 and 678) of the intermediate guide member 630, so that the right and left blades 612 and 613 move so as to approach each other while maintaining the parallel posture to the right and left sides of the opening portion 204 (see FIG. 23B). With respect to the displacement from the second state (FIG. 23B) to the first state (FIG. 23A), since the right and left blade changing lever 611 is rotated counterclockwise as viewed from the front side by power from the actuator 651, the right and left blades 612 and 613 move so as to leave each other while maintaining the parallel posture to the right and left sides of the opening portion 204 by the reverse operation to the above description. The rotation angle of the right and left mask changing lever 611 by the actuator 651 is adjusted, whereby it is possible to adjust the opening regions at the left-side end portion and the right-side end portion of the opening portion 204 by the right and left blades 612 and 613.

Figure 24A:
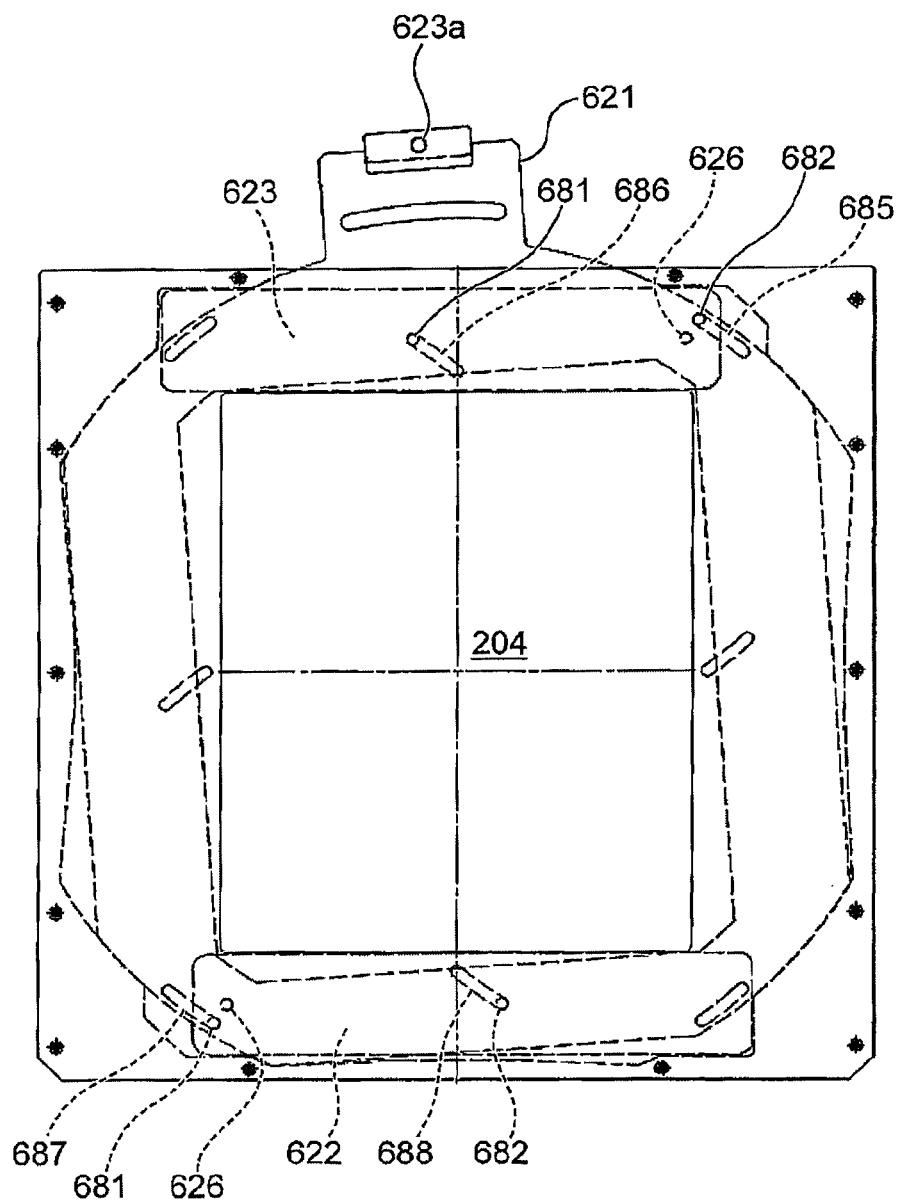
FIG. 24A is a front view of upper and lower masks under the first state.
Figure 24B:
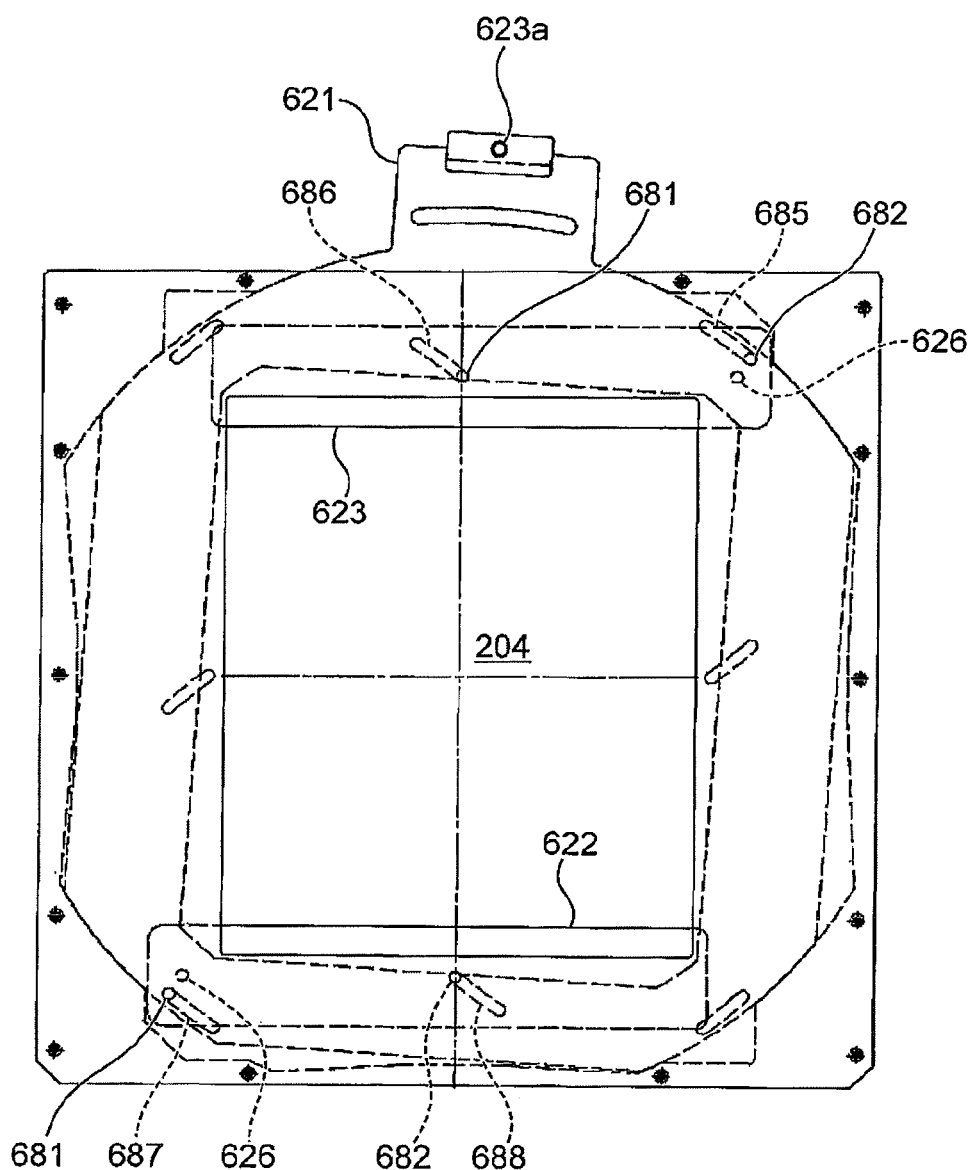
FIG. 24B is a front view of the upper and lower masks under the second state.

FIG. 24A is a front view of the upper and lower mask under the first state. FIG. 24B is a front view of the upper and lower mask under the second state. Under the first state (FIG. 24A), the upper and lower blades 622 and 623 are in a maximally expanded or separated state, the inner sides of the upper and lower blades 622 and 623 coincide with the upper side and the lower side of the opening portion 204 of the anode holder 200, respectively. The inner sides of the upper and lower blades 622 and 623 may be located outside the upper side and lower side of the opening portion 204 of the anode holder 200. Furthermore, the upper and lower blades 622 and 623 may be configured so that parts thereof overlap the opening portion 204 under the first state. Under the second state (FIG. 24B), the upper and lower blades 622 and 623 are in a minimally contracted or most closely approached state, and the inner sides of the upper and lower blades 622 and 623 are displaced inwards from the upper side and lower side of the opening portion 204 of the anode holder 200 by the maximum amount.

When the upper and lower blade changing lever 621 is rotated clockwise as viewed from the front side under the first state (FIG. 24A) by power from the actuator 652, the pins 626 of the upper and lower blades 622 and 623 also rotate clockwise. However, the guide pins 681 and 682 of the upper and lower blades 622 and 623 are guided by the guide grooves 687 and 688 (685 and 686) of the intermediate guide member 630, so that the upper and lower blades 622 and 623 move so as to approach each other while maintaining the parallel posture to the upper and lower sides of the opening portion 204 (see FIG. 24B). With respect to the displacement from the second state (FIG. 24B) to the first state (FIG. 24A), since the upper and lower blade changing lever 621 is rotated counterclockwise as viewed from the front side by power from the actuator 651, the upper and lower blades 622 and 623 move so as to leave each other while maintaining the parallel posture to the upper and lower sides of the opening portion 204 by the reverse operation to the above description. The rotation angle of the upper and lower mask changing lever 621 by the actuator 652 is adjusted, whereby it is possible to adjust the opening regions at the upper-side end portion and the lower-side end portion of the opening portion 204 by the upper and lower blades 622 and 623.

FIG. 25 shows a modification of the anode holder according to the fourth embodiment. As shown in FIG. 25, a sliding member 670 may be provided in at least one of the gap between the right and left mask 610 and the anode holder 200 and the gap between the upper and lower mask 620 and the front side guide member 640, whereby the rotational motion of the right and left mask 610 and/or the upper and lower mask 620 can be smoothed.

In the above description, the right and left mask 610 is arranged between the anode holder 200 and the intermediate guide member 630, and the upper and lower mask 620 is arranged between the intermediate guide member 630 and the front side guide member 640. However, contrary to this arrangement, the upper and lower mask 620 may be arranged between the anode holder 200 and the intermediate guide member 630 while the right and left mask 610 is arranged between the intermediate guide member 630 and the front side guide member 640.

In the above description, in order to guide the right and left blades 612 and 613, the guide grooves are provided in the intermediate guide member 630 so as to be engaged with guide pins formed on the right and left blades. However, the intermediate guide member 630 may be provided with guide pins while the right and left blades 612 and 613 are provided with guide grooves. However, in each case, it is desirable that either the guide pins or the guide grooves be fixed with respect to the anode mask 600. In other words, it is desirable that either the guide pins or the guide grooves be fixed to a moveless configuration of the anode mask 600 (a member functioning as the base plate of the anode mask: for example, the intermediate guide member, the front side guide member, or the anode holder). In the above description, in order to move the right and left blades 612 and 613, the engaging holes are provided in the right and left blade changing lever 611 so as to engage with the engaging pins of the right and left blades 612 and 613. However, guide grooves may be provided in the right and left blade changing lever 611 so as to engage with the engaging pins of the right and left blades 612 and 613 so that the right and left blades 612 and 613 slide while rotating with respect to the right and left blade changing lever 611.

Furthermore, in the above description, one engaging site is provided between the right and left blade and the right and left blade changing lever 611 in order to move the right and left blade, and two engaging sites are provided between the right and left blade and the intermediate guide member 630 in order to guide the right and left blade. However, the number of the engaging sites is not limited to the above number. For example, two engaging sites may be provided between the right and left blade and the right and left blade changing lever 611 in order to move the right and left blade while one engaging site is provided between the right and left blade and the intermediate guide member 630 in order to guide the right and left blade.

The configuration of the anode mask according to the fourth embodiment can also be applied to the regulation plate as described with reference to the first embodiment. In addition, the opening regions of the anode mask and the regulation plate according to the fourth embodiment can also be adjusted by the controller as described with reference to the first embodiment.

According to the above description, the anode mask which is integrally fitted to the anode holder 200 and adjusts the exposed region (opening region) of the anode electrode AN is capable of adjusting opening regions in the right and left direction and the up and down direction of the opening portion of the anode mask independently of each other. Also, an adjustment plate 12' arranged between the substrate holder 11 and the anode unit 12 also has a mechanism similar to that of the anode mask, and is capable of adjusting opening regions in the right and left direction and the up and down direction of an opening portion of the adjustment plate 12' independently of each other. The anode mask and the adjustment plate 12' will be collectively referred to as "electric field shielding body". When the electric field shielding body is arranged in the vicinity of the anode electrode like the anode mask, it is effective to adjust the plating film thickness of the whole substrate, and when the electric field shielding body is arranged at a position relatively close to the substrate holder like the adjustment plate 12', it is effective to adjust the plating film thickness at the outer peripheral portion of the substrate.

The anode electrode AN or the anode holder for holding the anode electrode AN is collectively referred to as an "anode". The anode is arranged at a position facing the substrate holder.

At least the following configurations can be grasped from the above embodiments.

According to a first aspect, there is provided a plating apparatus including: a plating bath; a substrate holder to be arranged in the plating bath and adapted to hold a substrate; an anode arranged so as to face the substrate holder; and at least one electric field shielding body for shielding a part of an electric field from the anode to the substrate, wherein the electric field shielding body has an opening portion for allowing the electric field between the substrate and the anode to pass therethrough, and is configured so as to be capable of adjusting an opening size in a first direction of the opening portion and an opening size in a second direction of the opening portion independently of each other. Here, the anode has an anode electrode. Also, the anode may have an anode electrode and an anode holder for holding the anode electrode. The electric field shielding body may include at least one of an anode mask and a regulation plate.

According to the first aspect, an opening region of the electric field shielding body can be adjusted independently in the first direction and the second direction (for example, the right and left direction and the up and down direction). Accordingly, the electric field between the substrate and the anode can be adjusted independently in the first direction and the second direction (for example, the right and left direction and the up and down direction), and the electric field can be more precisely controlled depending on the arrangement of the plating pattern and the method of supplying power to the anode, so that the uniformity of the plating film thickness can be enhanced.

According to a second aspect, in the plating apparatus according to the first aspect, the electric field shielding body includes one or more first shielding members and one or more second shielding members, the one or more first shielding members being arranged on at least one side of first and second end portions in the first direction of the opening portion, the one or more second shielding members being arranged on at least one side of third and fourth end portions in the second direction of the opening portion.

According to the second aspect, the opening region can be adjusted on at least one side of the first and second end portions in the first direction of the opening portion, and the opening region can be adjusted on at least one side of the third and fourth end portions in the second direction of the opening portion.

According to a third aspect, in the plating apparatus according to the second aspect, the one or more first shielding members are arranged on both sides of the first and second end portions in the first direction of the opening portion, and the one or more first shielding members at the respective end portions are moved in opposite directions.

According to the third aspect, since the opening size is adjusted in opposite directions on both the first and second sides in the first direction of the opening portion, it is easy to adjust the opening region while maintaining symmetry.

According to a fourth aspect, in the plating apparatus according to the second aspect, the one or more first shielding members are arranged on both sides of the first and second end portions in the first direction of the opening portion, and the one or more first shielding members at the respective end portions are moved by the same amount.

According to the fourth aspect, since the opening size is adjusted on both sides of the first and second end portions in the first direction of the opening portion by the same amount, it is easy to adjust the opening region while maintaining symmetry.

According to a fifth aspect, in the plating apparatus according to the second aspect, the one or more first shielding members are arranged on both sides of the first and second end portions in the first direction of the opening portion, and the one or more first shielding members at the respective end portions are moved by independent driving sources, respectively.

According to the fifth aspect, the opening region can be individually adjusted on both sides of the first and second end portions in the first direction of the opening portion. In this case, it is possible to adjust the opening region in the first direction of the opening portion so as to adjust a center position of the opening region of the opening portion. The respective driving sources may be controlled so that the one or more first shielding members at the respective end portions are moved in synchronism with one another.

According to a sixth aspect, in the plating apparatus according to any one of the second to fifth aspects, at least one of the one or more first shielding members and the one or more second shielding members is moved by a feed screw mechanism.

According to the sixth aspect, a driving mechanism for a shielding member can be easily configured by a feed screw mechanism. In addition, a plurality of shielding members can be moved accurately and synchronously.

According to a seventh aspect, in the plating apparatus according to any one of the second to fifth aspects, at least one of the one or more first shielding members and the one or more second shielding members is moved by a rack and pinion mechanism.

According to the seventh aspect, a driving mechanism for a shielding member can be easily configured by a rack and pinion mechanism. In addition, a plurality of shielding members can be moved accurately and synchronously.

According to an eighth aspect, in the plating apparatus according to the second aspect, the electric field shielding body has the first shielding member arranged on a side of the first end portion in the first direction of the opening portion, a first link member that is rotatably connected to the first shielding member forms a first link mechanism together with the first shielding member, and rotation of the first link member is converted into movement of the first shielding member.

According to the eighth aspect, since a rotational motion of a first link member is converted into the movement of the first shielding member, a driving mechanism for the first shielding member can be configured with a space-saving and simple configuration.

According to a ninth aspect, in the plating apparatus according to the eighth aspect, the electric field shielding body further includes a base, one end of the first shielding member is rotatably connected to the first link member, the other end of the first shielding member is rotatably connected to a second link member which is rotatably connected to the base, the second link member forms a second link mechanism together with the first shielding member, and the first shielding member is translated by rotation of the first link member and the second link member.

According to the ninth aspect, a translational motion of the one or more first shielding members can be realized with a space-saving and simple configuration by rotation of the first link member and the second link member connected to both ends of the one or more first shielding members.

According to a tenth aspect, in the plating apparatus according to the second aspect, the electric field shielding body further includes a base, elongated holes are formed in each of the first shielding members arranged respectively on the sides of the first and second end portions in the first direction of the opening portion, two pins formed in a third link member which is rotatably connected to the base are inserted into the elongated holes of each of the first shielding members, and the first shielding member arranged on the side of the first end portion in the first direction of the opening portion and the first shielding member arranged on a side of the second end portion in the first direction of the opening portion are moved in opposite directions by rotation of the third link member.

According to the tenth aspect, the first shielding members at both the end portions can be synchronously moved. Furthermore, an extension portion extending to the other side is formed in the first shielding member on one end side, and each of the first shielding members is engaged with a third link on the other end side, whereby driving mechanisms can be aggregated on the other end side, and space saving can be performed. For example, the driving mechanisms for the first shielding members at the upper end portion and the lower end portion can be aggregated above a plating solution level.

According to an eleventh aspect, in the plating apparatus according to the second aspect, the electric field shielding body includes a base, the one or more first shielding members arranged on a side of the first end portion in the first direction of the opening portion, a guide groove fixed with respect to the base, and a guide pin fixed with respect to the one or more first shielding members, and the guide pin moves along the guide groove, whereby the one or more first shielding members are guided. The guide groove fixed with respect to the base may be a guide groove provided in a base or in a member fixed to the base.

According to the eleventh aspect, since the one or more first shielding members are engaged with an engaging portion fixed with respect to the base to be guided, it is possible to enhance the accuracy in a movement direction of the one or more first shielding members, and it is possible to precisely control movement amounts of the one or more first shielding members.

According to a twelfth aspect, in the plating apparatus according to the second aspect, the electric field shielding body includes a base, the one or more first shielding members arranged on a side of the first end portion in the first direction of the opening portion, a guide pin fixed with respect to the base, and a guide groove fixed with respect to the one or more first shielding members, and the guide pin moves along the guide groove, whereby the one or more first shielding members are guided. The guide groove fixed with respect to the first shielding member may be a guide groove provided in a first shielding member or in a member fixed to the first shielding members.

According to the twelfth aspect, since the one or more first shielding members are engaged with an engaging portion fixed with respect to the base, it is possible to enhance the accuracy in a movement direction of the one or more first shielding members, and it is possible to precisely control the movement amounts of the one or more first shielding members.

According to a thirteenth aspect, there is provided a plating apparatus including: a plating bath; a substrate holder to be arranged in the plating bath and adapted to hold a substrate; an anode arranged so as to face the substrate holder; and at least one electric field shielding body for shielding a part of an electric field from the anode to the substrate, wherein the electric field shielding body has three or more shielding members each having an opening portion for allowing the electric field from the anode to pass therethrough, and at least two of the shielding members are configured to be movable relatively to at least one of the shielding members so as to adjust an opening region formed by overlapping the respective opening portions.

According to the thirteenth aspect, since an opening region of an electric field shielding member is adjusted by moving the at least two shielding members each having the opening portion, so that it is possible to adjust the opening region with a simple configuration.

According to a fourteenth aspect, in the plating apparatus according to the thirteenth aspect, the electric field shielding body includes: a first shielding member including a first opening portion having a size in a first direction and a size in a second direction; a second shielding member having a second opening portion; and a third shielding member having a third opening portion, the second shielding member is movable along a third direction between the first direction and the second direction with respect to the first shielding member so as to adjust a region where the first opening portion and the second opening portion overlap each other, and the third shielding member is movable along a fourth direction between the first direction and the second direction with respect to the first shielding member so as to adjust a region where the first opening portion and the third opening portion overlap each other.

According to the fourteenth aspect, by moving each of the shielding members in a direction between the first and second directions, opening regions in the first and second directions can be simultaneously adjusted by each of the shielding members. Furthermore, a large adjustment amount can be obtained for the opening region by a small movement amount of each of the shielding members.

According to a fifteenth aspect, in the plating apparatus according to any one of the first to fourteenth aspects, the anode includes an anode holder for holding an anode electrode, and has the electric field shielding body provided integrally with the anode holder.

In the case of the electric field shielding body which is provided integrally with the anode holder, the electric field shielding body can be arranged to be close to the anode electrode and far from the substrate, which is advantageous to control of the film thickness of an entire plating surface of the substrate. In addition, since the anode holder and the electric field shielding body are integrated with each other, space saving can be achieved.

According to a sixteenth aspect, in the plating apparatus according to any one of the first to fifteenth aspects, the anode includes an anode holder for holding an anode electrode, and has the electric field shielding body provided separately from the anode holder.

In the case of the electric field shielding body which is provided separately from the anode holder, the electric field shield body can be arranged to be close to the substrate, which is advantageous to control of the film thickness at an outer peripheral portion of the substrate. In addition, by providing an electric field shielding body arranged to be close to the substrate and an electric field shielding member arranged to be close to the anode electrode and far from the substrate, the control of the film thickness of the substrate can be further enhanced. In addition, it is possible to perform maintenance of the anode and the electric field shielding body individually.

According to a seventeenth aspect, in the plating apparatus according to any one of the first to sixteenth aspects, the first shielding member and/or the second shielding member is driven by power from a motor, a solenoid, or an air cylinder.

According to the seventeenth aspect, the movement of the shielding member can be precisely controlled with the power from the motor, the solenoid, or the air cylinder.

According to an eighteenth aspect, in the plating apparatus of any one of the first to seventeenth aspects, the opening portion is rectangular.

According to this aspect, the electric field can be more precisely controlled according to various aspect ratios of the rectangular substrate, and the uniformity of the plating film thickness can be enhanced. In addition, the electric field can be more precisely controlled according to the arrangement of a plating pattern and the method of supplying power to the anode, so that the uniformity of the plating film thickness can be enhanced.

According to a nineteenth aspect, in the plating apparatus according to any one of the first to eighteenth aspects, the anode includes an anode holder for holding an anode electrode, the at least one electric field shielding body includes a first electric field shielding body and a second electric field shielding body arranged to be nearer to the substrate than the first electric field shielding body, the first electric field shielding body is provided integrally with the anode holder, and the second electric field shielding body is provided separately from the anode holder, and arranged at an intermediate position between the substrate holder and the anode holder.

According to this aspect, in the second electric field shielding body arranged to be close to the substrate and the first electric field shielding body arranged to be far from the substrate and close to the anode, opening sizes in a plurality of directions of each opening region are independently controlled and/or opening sizes in a plurality of directions of the electric field shielding body are precisely controlled, whereby a distribution of a plating film thickness can be more finely controlled.

According to a twentieth aspect, in the plating apparatus according to the nineteenth aspect, the area of the substrate held by the substrate holder is larger than the opening area of the second electric field shielding body, and the opening area of the second opening portion of the second electric field shielding body is larger than the opening area of the first electric field shielding body.

According to the twentieth aspect, the electric field between the anode and the substrate can be excellently adjusted, and the uniformity of the plating film thickness can be enhanced.

According to a twenty-first aspect, the plating apparatus according to any one of the first to twentieth aspects further includes a controller, and the controller controls the at least one electric field shielding body so as to change the area of the opening portion of the at least one electric field shielding body during plating.

According to the twenty-first aspect, the electric field on the substrate can be adjusted according to variation of the strength of the terminal effect during the plating processing. For example, since the terminal effect acts strongly on an early stage of plating, the opening region of the at least one electric field shielding body is made small to prevent increase of the plating film thickness at the outer peripheral portion of the substrate. Since the terminal effect is alleviated on a stage where the plating progresses and the plating film thickness increases as a whole, the opening region of the at least one electric field shielding body is expanded, whereby the uniformity of the plating film thickness can be further enhanced.

Although the embodiments of the present invention have been described based on some examples, the embodiments of the invention described above are presented to facilitate understanding of the present invention, and do not limit the present invention. The present invention can be altered and improved without departing from the subject matter of the present invention, and it is needless to say that the present invention includes equivalents thereof. For example, the shape of a large substrate is not limited to a rectangle, but may be a square shape, or other polygonal shapes, for example, a pentagonal shape or a hexagonal shape. Furthermore, it is needless to say that the present invention is also applicable to a plating apparatus for processing a substrate having a circular shape. In addition, it is possible to arbitrarily combine or omit respective constituent elements described in the claims and the specification in a range where at least a part of the above-mentioned problem can be solved or a range where at least a part of the effect is exhibited.

The present application claims priority to Japanese Patent Application No. 2017-182570 filed on Sep. 22, 2017. The entire disclosure of Japanese Patent Application No. 2017-182570 filed on Sep. 22, 2017 including specification, claims, drawings and summary is incorporated herein by reference in its entirety.

The entire disclosure of Japanese Patent Laid-Open No. 2016-98399 (PTL 1) and Japanese Patent Laid-Open No. H6-17297 (PLT 2) including specification, claims, drawings and summary is incorporated herein by reference in its entirety.

REFERENCE SIGNS LIST 10, 10a, 10b, 10c plating bath
12 anode unit
14' regulation plate
200 anode holder
204 opening portion
300, 400, 500, 600 anode mask
311 left mask
312 right mask
313 upper mask
314 lower mask
315, 316 guide member
317, 318, 319, 320 rack gear
326, 327 pinion gear
321, 322 motor
416 link
421, 422 actuator
411 left mask
412 right mask
413 upper mask
414 lower mask
453, 454 link
501 base
510, 520 shielding member
530 motor
534, 537 pinion
541, 542 link
612, 613 right and left blade
622, 623 upper and lower blade
651, 652 actuator
An anode electrode

What is claimed is:

1. A plating apparatus comprising:
a plating bath;
a substrate holder to be arranged in the plating bath and adapted to hold a substrate;
an anode arranged so as to face the substrate holder, the anode including an anode electrode and an anode holder for holding the anode electrode such that the anode electrode is exposed from a rectangular first opening portion provided in the anode holder; and
at least one electric field shielding body for shielding a part of an electric field from the anode electrode to the substrate, wherein the at least one electric field shielding body has a second opening portion for allowing the electric field between the substrate and the anode to pass therethrough, and is configured so as to be capable of adjusting an opening size in a first direction of the second opening portion and an opening size in a second direction of the second opening portion independently of each other,
wherein the at least one electric field shielding body includes one or more first shielding members and one or more second shielding members, the one or more first shielding members being arranged on at least one side of first and second end portions in the first direction of the second opening portion, the one or more second shielding members being arranged on at least one side of third and fourth end portions in the second direction of the second opening portion, and
the at least one electric field shielding body has one of the one or more first shielding members arranged on the side of the first end portion in the first direction of the second opening portion, a first link member rotatably connected to the one of the one or more first shielding members by a pin forms a first link mechanism together with the one of the one or more first shielding members, and the one of the one or more first shielding members is translated by rotation of the first link member around an axis perpendicular to the exposed surface of the anode electrode.

2. The plating apparatus according to claim 1, wherein the one or more first shielding members comprise two first shielding members arranged on both sides of the first and second end portions in the first direction of the second opening portion, and the two first shielding members at the respective end portions are movable in opposite directions.

3. The plating apparatus according to claim 1, wherein the one or more first shielding members comprise two first shielding members arranged on both sides of the first and second end portions in the first direction of the second opening portion, and the two first shielding members at the respective end portions are movable by the same amount.

4. The plating apparatus according to claim 1, wherein the one or more first shielding members comprise two first shielding members arranged on both sides of the first and second end portions in the first direction of the second opening portion, and the two first shielding members at the respective end portions are movable by independent driving sources, respectively.

5. The plating apparatus according to claim 1, wherein the one or more second shielding members is moved by a feed screw mechanism.

6. The plating apparatus according to claim 1, wherein the one or more second shielding members is moved by a rack and pinion mechanism.

7. The plating apparatus according to claim 1, wherein the at least one electric field shielding body further includes a base, one end of the one of the one or more first shielding members arranged on the side of the first end portion is rotatably connected to the first link member, the other end of the one of the at least one first shielding members is rotatably connected to a second link member which is rotatably connected to the base, the second link member forms a second link mechanism together with the at least one of the one or more first shielding members, and at least one of the one or more the first shielding members is translated by rotation of the first link member and the second link member, wherein the base is the anode holder or a component separate from the anode holder.

8. The plating apparatus according to claim 1, wherein the at least one electric field shielding body further includes a base, elongated holes are formed in each of the one or more second shielding members arranged respectively on the sides of the third and fourth end portions in the second direction of the second opening portion, two pins formed in a third link member which is rotatably connected to the base are inserted into the elongated holes of each of the one or more second shielding members, and the one or more second shielding member arranged on a side of the third end portion in the second direction of the second opening portion and the one or more second shielding member arranged on a side of the fourth end portion in the second direction of the second opening portion are moved in opposite directions by rotation of the third link member, wherein the base is the anode holder or a component separate from the anode holder.

9. The plating apparatus according to claim 1, wherein the at least one electric field shielding body includes a base, the one or more second shielding members arranged on a side of the third end portion in the second direction of the second opening portion, a guide groove fixed with respect to the base, and a guide pin fixed with respect to the one or more second shielding members, and the guide pin moves along the guide groove, whereby the one or more first shielding members are guided.

10. The plating apparatus according to claim 1, wherein the at least one electric field shielding body includes a base, the one or more second shielding members arranged on a side of the third end portion in the second direction of the second opening portion, a guide pin fixed with respect to the base, and a guide groove fixed with respect to the one or more second shielding members, and the guide pin moves along the guide groove, whereby the one or more first shielding members are guided.

11. The plating apparatus according to claim 1, wherein the at least one electric field shielding body has a first electric field shielding body provided integrally with the anode holder.

12. The plating apparatus according to claim 1, wherein the at least one electric field shielding body has a second electric field shielding body provided separately from the anode holder.

13. The plating apparatus according to claim 1, wherein the one or more first shielding members and/or the one or more second shielding members are driven by power from a motor, a solenoid, or an air cylinder.

14. The plating apparatus according to claim 1, wherein the second opening portion is rectangular.

15. The plating apparatus according to claim 1, wherein
the at least one electric field shielding body includes a first electric field shielding body and a second electric field shielding body arranged to be nearer to the substrate than the first electric field shielding body,
the first electric field shielding body is provided integrally with the anode holder, and
the second electric field shielding body is provided separately from the anode holder, and arranged between the substrate holder and the anode holder.

16. The plating apparatus according to claim 15, wherein the second opening portion comprises an opening area in the first electric field shielding body and an opening area in the second electric field shielding body, wherein an exposed area of the plating target surface of the substrate held by the substrate holder is larger than the opening area of the second electric field shielding body, and the opening area of the second electric field shielding body is larger than the opening area of the first electric field shielding body.

17. The plating apparatus according to claim 1, further comprising a controller, wherein the controller controls the at least one electric field shielding body so as to change an area of the opening portion of the at least one electric field shielding body during plating.

18. The plating apparatus according to claim 1, wherein
the one or more first shielding members arranged on the first and second end portions are one or more left and right masks,
the one or more second shielding members arranged on the third and fourth end portions are one or more upper and lower masks, and
the one or more left and right masks are moved by a first driving source, and the one or more left and right masks are moved by a second driving source.

19. The plating apparatus according to claim 1, wherein
the at least one electric field shielding body includes a first electric field shielding body provided integrally with the anode holder,
the first opening portion of the anode holder is rectangular,
the one or more first shielding members arranged on the first and second end portions are one or more left and right masks, and
the one or more second shielding members arranged on the third and fourth end portions are one or more upper and lower masks.

* * * * *